(12) United States Patent
Tzeng et al.

(10) Patent No.: US 11,127,780 B2
(45) Date of Patent: Sep. 21, 2021

(54) DISPLAY PANEL

(71) Applicant: Au Optronics Corporation, Hsinchu (TW)

(72) Inventors: Bo-Shiang Tzeng, Kaohsiung (TW); Chia-Wei Kuo, Hsinchu County (TW); Chia-Ting Hsieh, Hsinchu (TW); Pin-Miao Liu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/745,309

(22) Filed: Jan. 16, 2020

(65) Prior Publication Data

US 2020/0243600 A1 Jul. 30, 2020

(30) Foreign Application Priority Data

Jan. 28, 2019 (TW) .................................. 108103051

(51) Int. Cl.
*H01L 27/15* (2006.01)
*H01L 33/60* (2010.01)
(Continued)

(52) U.S. Cl.
CPC .......... *H01L 27/156* (2013.01); *H01L 23/544* (2013.01); *H01L 27/124* (2013.01);
(Continued)

(58) Field of Classification Search
CPC ............... H01L 23/544; H01L 23/3128; H01L 23/5389; H01L 23/49833; H01L 25/167;
(Continued)

(56) References Cited

U.S. PATENT DOCUMENTS 7,095,389 B2   8/2006   Uehara et al.
7,940,234 B2   5/2011   Iida et al.
(Continued)

FOREIGN PATENT DOCUMENTS

CN   101246667   8/2008
CN   104752471   7/2015
(Continued)

OTHER PUBLICATIONS

"Office Action of Taiwan Counterpart Application", dated Mar. 31, 2021, p. 1-p. 14.

*Primary Examiner* — Nikolay K Yushin
(74) *Attorney, Agent, or Firm* — JCIPRNET

(57) ABSTRACT

A display panel including data lines, scan lines, pixel structures, power lines and a fixing layer is provided. The pixel structure includes a first transistor, a second transistor and a light emitting diode device. The first transistor is electrically coupled to a corresponding scan line, a corresponding data line and the second transistor. A first end of the light emitting diode device is electrically coupled to the second transistor. The power lines are electrically coupled to the second transistor of at least one of the pixel structures and a second end of the light emitting diode device of at least one of the pixel structures. The fixing layer is disposed on at least one of the power lines. The light emitting diode device of at least one of the pixel structures is disposed on the fixing layer and overlapped with the at least one of the power lines.

17 Claims, 18 Drawing Sheets

(51) Int. Cl.
  *H01L 23/544* (2006.01)
  *H01L 27/12* (2006.01)
  *H01L 33/62* (2010.01)
  *G09G 3/32* (2016.01)
  *H01L 33/06* (2010.01)
  *H01L 33/32* (2010.01)

(52) U.S. Cl.
  CPC .......... *H01L 27/1248* (2013.01); *H01L 33/60* (2013.01); *H01L 33/62* (2013.01); *G09G 3/32* (2013.01); *G09G 2300/08* (2013.01); *H01L 33/06* (2013.01); *H01L 33/32* (2013.01); *H01L 2223/54426* (2013.01)

(58) Field of Classification Search
  CPC ... H01L 25/0753; H01L 25/50; H01L 27/124; H01L 27/156; H01L 27/1248; H01L 33/62; H01L 33/60; H01L 33/06; H01L 33/32; H01L 2223/54426; H01L 2223/6677; H01L 2223/54453; H01L 2223/5442; G09G 3/32; G09G 3/3266; G09G 3/3233; G09G 3/3275; G09G 3/3258; G09G 2300/0842; G09G 2300/08; G09G 2300/0426; G09G 2300/0819; G09G 2320/0295
  See application file for complete search history.

(56) References Cited

U.S. PATENT DOCUMENTS

| | | | |
|---|---|---|---|
| 9,269,757 B2 | 2/2016 | Kim et al. | |
| 10,079,265 B1 | 9/2018 | Wu et al. | |
| 10,424,615 B2 | 9/2019 | Wu et al. | |
| 10,453,909 B2 | 10/2019 | Li et al. | |
| 10,671,195 B2 * | 6/2020 | Lin | G09G 3/006 |
| 10,809,847 B2 * | 10/2020 | Gupta | G06F 3/0443 |
| 2002/0036628 A1 | 3/2002 | Uehara et al. | |
| 2008/0117146 A1 | 5/2008 | Iida et al. | |
| 2014/0225838 A1 * | 8/2014 | Gupta | G06F 3/04184 |
| | | | 345/173 |
| 2015/0187861 A1 | 7/2015 | Kim et al. | |
| 2018/0261663 A1 | 9/2018 | Li et al. | |
| 2018/0335881 A1 * | 11/2018 | Lin | H01L 27/3276 |
| 2018/0337214 A1 | 11/2018 | Wu et al. | |

FOREIGN PATENT DOCUMENTS

| | | |
|---|---|---|
| CN | 105789266 | 7/2016 |
| TW | 594329 | 6/2004 |
| TW | 201349433 | 12/2013 |
| TW | 201901394 | 1/2019 |
| TW | 201901947 | 1/2019 |

* cited by examiner

DISPLAY PANEL

CROSS REFERENCE TO RELATED APPLICATION

This application claims the priority benefit of Taiwan application serial no. 108103051, filed on Jan. 28, 2019. The entirety of the above-mentioned patent application is hereby incorporated by reference herein and made a part of specification.

BACKGROUND

Field of the Disclosure

The disclosure relates to a display panel, and more particularly to a display panel having a good display quality.

Description of Related Art

A light-emitting diode (LED) display panel includes a pixel array substrate and a plurality of micro-LEDs that are transferred to the pixel array substrate. Involving the characteristics of the LED, the LED display panel has the advantages of power saving, high efficiency, high brightness and fast responding time. In addition, as compared with the organic LED display panel, the LED display panel has the advantages of easy color adjustment, long LED life time, and less image sticking. Therefore, the LED display panel is regarded as the display technology of the next generation.

However, as the resolution of the LED display panel is continuously increased, the layout space of the electronic components and the trace structure in the pixels is smaller. Therefore, while improving the resolution, how to increase the layout space for circuit in the pixels is one of the problems that manufacturers want to solve.

SUMMARY OF THE DISCLOSURE

The disclosure provides a display panel with good display quality.

A display panel according to an embodiment of the disclosure includes a plurality of data lines, a plurality of scan lines, a plurality of pixel structures, a plurality of power lines, and a fixing layer. The pixel structure includes a first transistor, a second transistor, and a light emitting diode (LED) device. The first transistor has a first end, a second end, and a control end. The control end of the first transistor is electrically coupled to a corresponding scan line, and the first end of the first transistor is electrically coupled to a corresponding data line. The second transistor has a first end, a second end, and a control end. The second end of the first transistor is electrically coupled to the control end of the second transistor. The LED device has a first end and a second end. The first end of the LED device is electrically coupled to the second end of the second transistor. The plurality of power lines are electrically coupled to the first end of the second transistor of the at least one pixel structure and the second end of the LED device of the at least one pixel structure. The fixing layer is disposed on at least one of the plurality of power lines. The LED device of the at least one pixel structure is disposed on the fixing layer and overlaps the at least one of power lines.

In an embodiment of the disclosure, in the display panel, the power line overlapping the LED device of the at least one pixel structure has a fixed voltage potential.

In an embodiment of the disclosure, in the display panel, the at least one of the power lines has at least one wide portion, and the LED device of the at least one pixel structure overlaps the wide portion.

In an embodiment of the disclosure, a portion of the vertical projection of the LED device of the display panel is located within the edge of the wide portion, and another portion of the vertical projection of the LED device is located outside the edge of the wide portion.

In an embodiment of the disclosure, the wide portion of the display panel has an alignment pattern.

In an embodiment of the disclosure, the alignment pattern of the display panel includes at least one opening.

In an embodiment of the disclosure, the vertical projection of the at least one opening of the display panel does not overlap the vertical projection of the LED device.

In an embodiment of the disclosure, in the display panel, the at least one of the power lines extends in the first direction. The second direction is interlaced with the first direction. The plurality of pixel structures include an Mth pixel structure and an M+1th pixel structure which are sequentially arranged in the second direction. The LED device of the Mth pixel structure and the LED device of the M+1th pixel structure are disposed on the same wide portion of the power line.

In an embodiment of the disclosure, in the display panel, a material of the power line overlapping the LED device of the at least one pixel structure includes a reflective material.

In an embodiment of the disclosure, in the display panel, the power line overlapping the LED device of the at least one pixel structure extends in the first direction. The overlapping area of the LED device and the power line has a width L in the second direction, L≥2 μm, and the first direction is interlaced with the second direction.

In an embodiment of the disclosure, in the display panel, the LED device overlapping the power line includes a first type semiconductor layer, a second type semiconductor layer, and a light emitting layer. The first type semiconductor layer is electrically connected to the first end of the LED device. The second type semiconductor layer is electrically connected to the second end of the LED device. The light emitting layer is disposed between the first type semiconductor layer and the second type semiconductor layer. The first end of the LED device and the second end of the LED device are located on a single side of the second type semiconductor layer.

In an embodiment of the disclosure, the first end of the LED device of the display panel overlaps another power line in a vertical projection direction.

In an embodiment of the disclosure, in the display panel, the LED device overlapping the power line includes a first type semiconductor layer, a second type semiconductor layer, and a light emitting layer. The first type semiconductor layer is electrically connected to the first end of the LED device. The second type semiconductor layer is electrically connected to the second end of the LED device. The light emitting layer is disposed between the first type semiconductor layer and the second type semiconductor layer. The first end of the LED device and the second end of the LED device are respectively located on opposite sides of the light emitting layer.

In an embodiment of the disclosure, the second end of the LED device of the display panel is located between the first end of the LED device and the fixing layer, and the second end of the LED device is electrically coupled to the power line.

In an embodiment of the disclosure, in the display panel, a power line overlapping the at least one LED device has a wide portion, and the at least one LED device overlaps the wide portion, and one of the plurality of data lines and the plurality of scan lines has a zigzag segment that conforms to the wide portion and is adjacent to the power line in parallel.

In an embodiment of the disclosure, in the display panel, a power line overlapping the at least one LED device has a wide portion, the at least one LED device overlaps the wide portion, and another power line has a zigzag segment that conforms to the wide portion and is adjacent to the at least one of power lines in parallel.

Based on the above, in the display panel of the embodiment of the disclosure, through the configuration that the LED device of the pixel structure overlaps the power line provided with the fixing layer, the circuit layout space of the pixel structure is increased, and thus increasing the design margin of the circuit.

In order to make the aforementioned features and advantages of the disclosure more comprehensible, embodiments accompanying figures are described in detail below.

DESCRIPTION OF EMBODIMENTS

Figure 1:
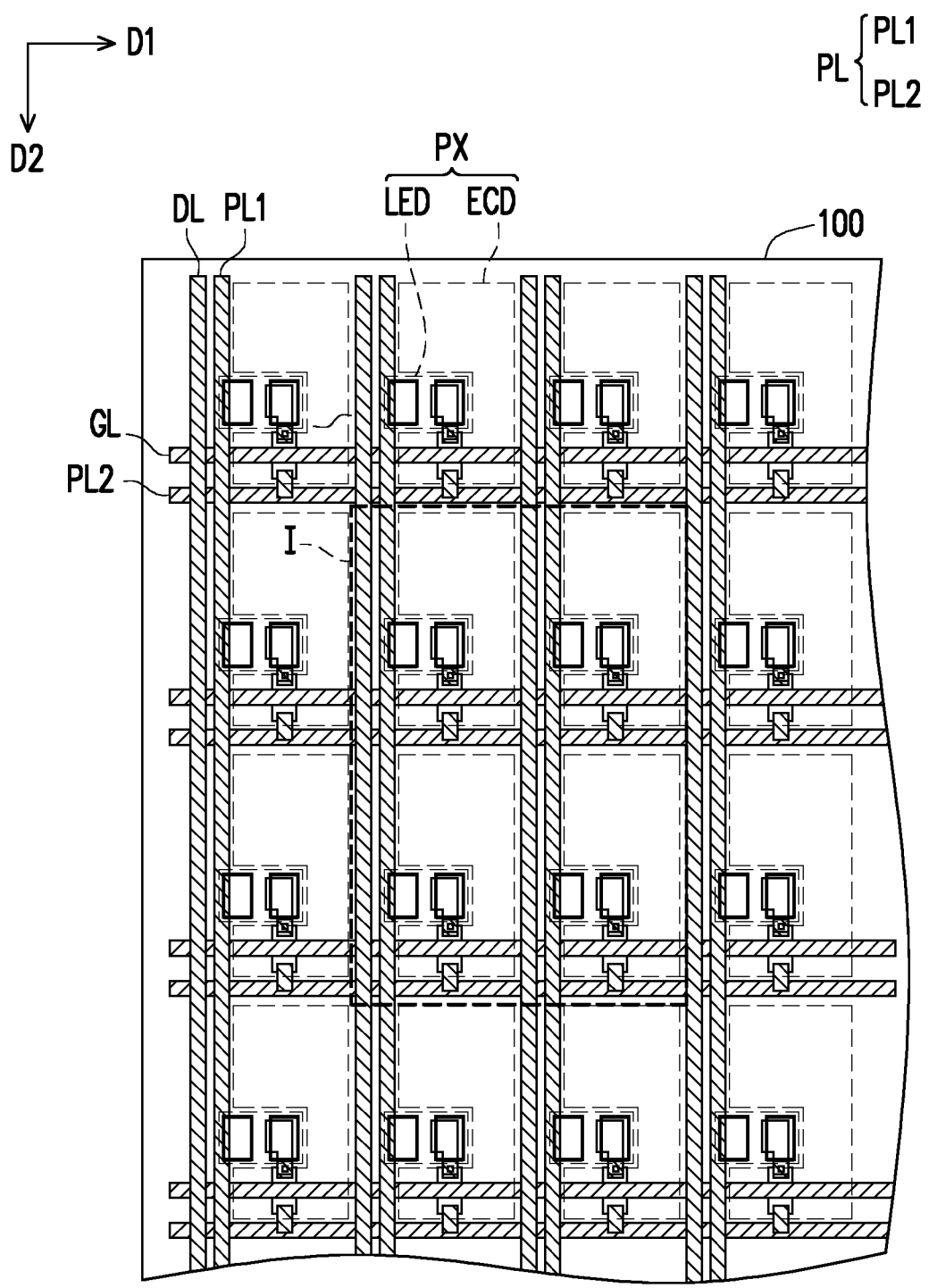
FIG. 1 is a schematic top view of a display panel according to the first embodiment of the disclosure.

Reference will now be made in detail to the present exemplary embodiments of the present disclosure, examples of which are illustrated in the accompanying drawings. Wherever possible, the same element numbers are used in the drawings and the description to refer to the same or like parts.

It will be understood that, when an element such as a layer, a film, an area or a substrate is referred to as being "on" or "connected" to another element, the element may be directly on another element, or connected to another element, or there may be an intermediate element. In contrast, when an element is referred to as "directly on" or "directly connected to" another element, there is no intermediate element. As used herein, "connected" may refer to both physical and/or electrical connections. Furthermore, "electrically connected" or "electrically coupling" may be the presence of other elements between two elements.

As used herein, "about," "approximate," or "substantially" includes the values and average values within acceptable ranges of the particular values determined by a person of ordinary skill in the art, in view of the discussed measurements and the specific number of errors associated with the measurements (that is, the limits of the measurement system). For example, "about" may represent within one or more standard deviations of the stated value, or within ±30%, ±20%, ±10%, and ±5%. Furthermore, as used herein, "about", "approximate" or "substantially" may select a more acceptable range or standard deviation depending on optical properties, etching properties or other properties, and may apply all properties without a standard deviation.

Unless otherwise defined, all terms (including technical and scientific terms) used herein have the same meaning as commonly understood by a person of ordinary skill in the art to which the present disclosure falls in. It will be further understood that terms such as those defined in commonly used dictionaries should be interpreted as having meanings consistent with their meanings in the context of the related art and the present disclosure, and will not be construed as idealized or excessively formal meaning, unless explicitly defined herein.

Figure 2:
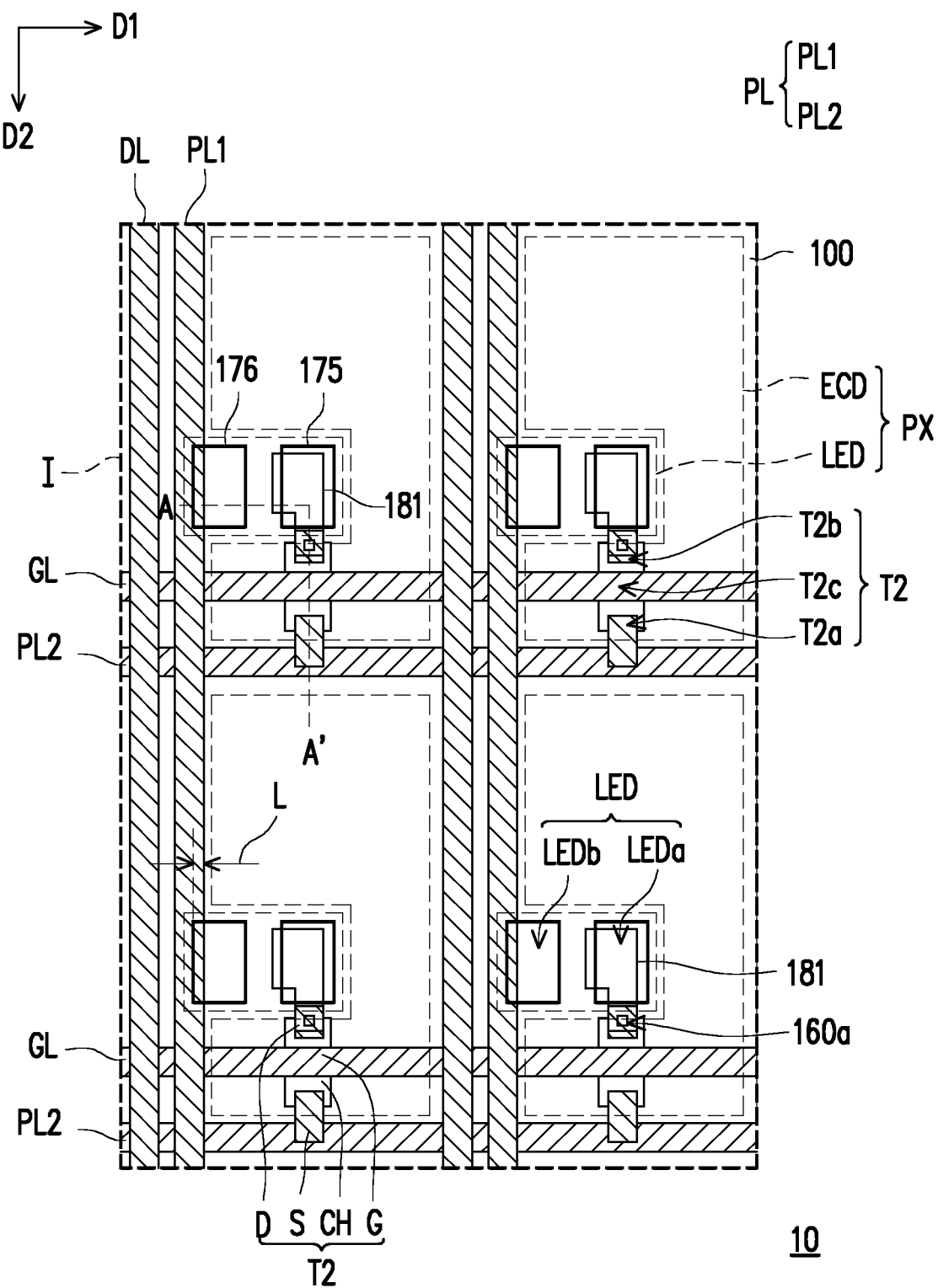
FIG. 2 is a schematic enlargement view of a partial region I of the display panel of FIG. 1.
Figure 3:
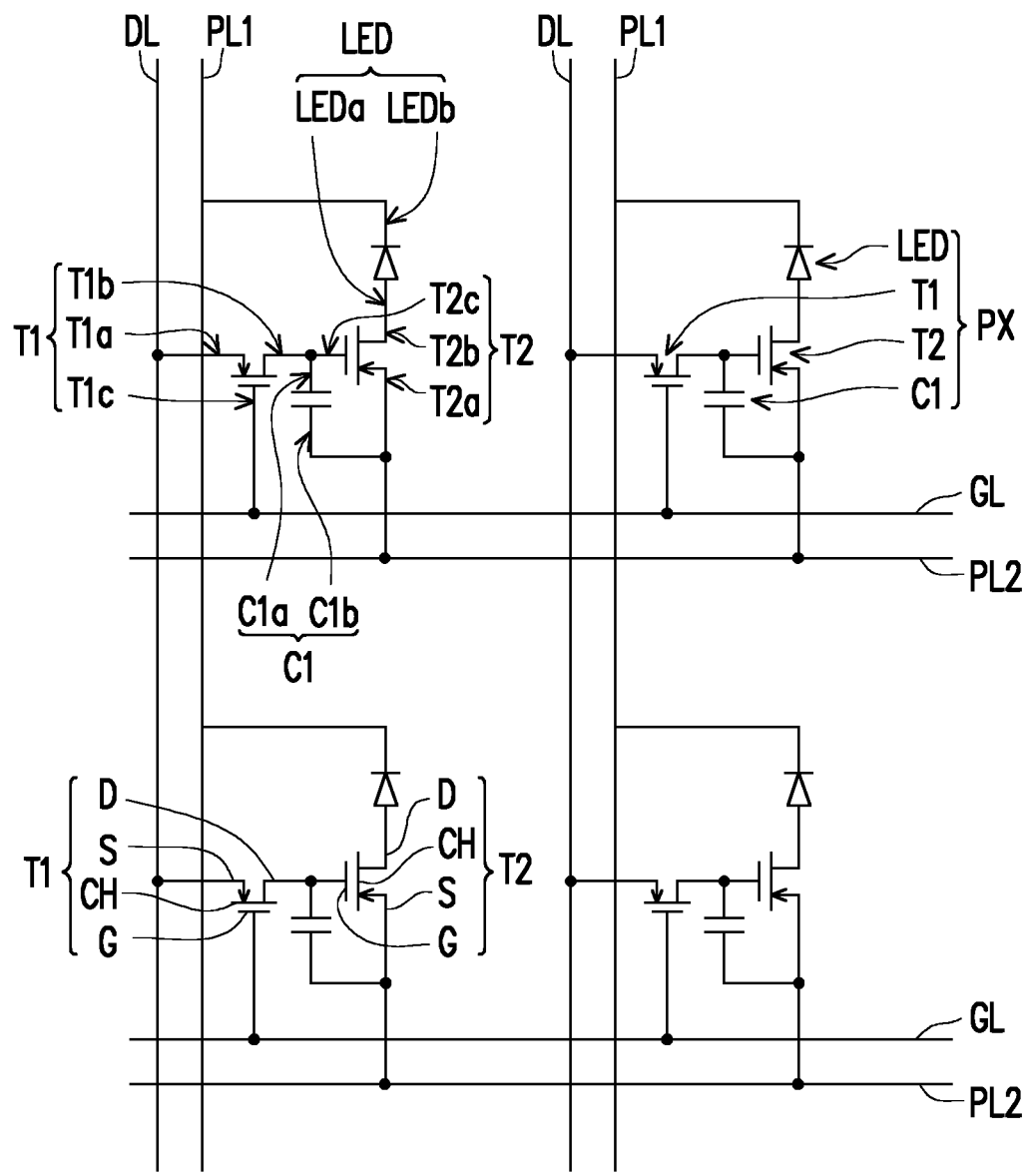
FIG. 3 is a schematic circuit diagram of a partial region I of the display panel of FIG. 2.
Figure 4:
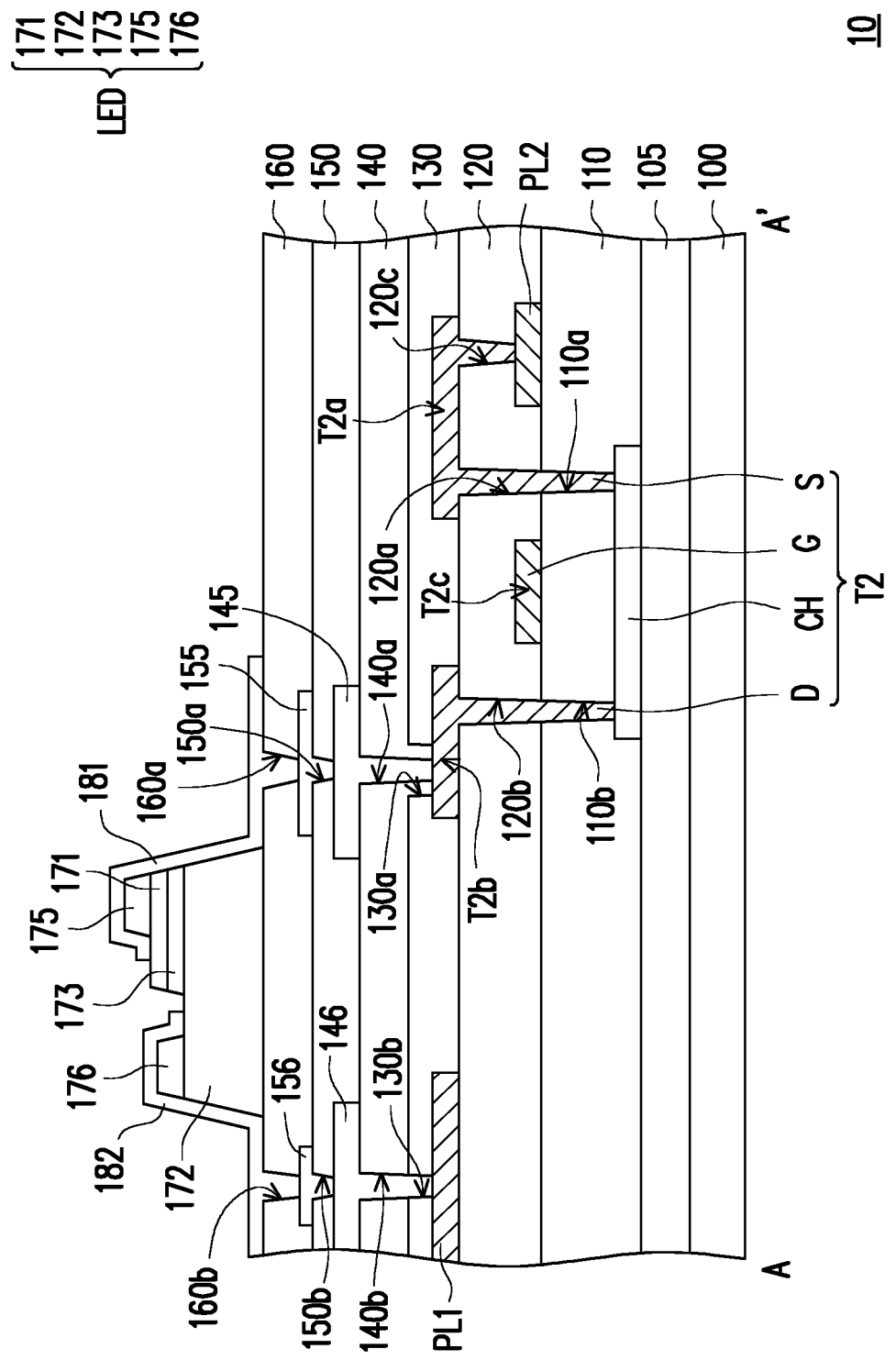
FIG. 4 is a schematic cross-sectional view of a partial region I of the display panel of FIG. 2.

FIG. 1 is a schematic top view of a display panel 10 according to the first embodiment of the present disclosure. FIG. 2 is a schematic enlargement view of a partial region I of the display panel 10 of FIG. 1. FIG. 3 is a schematic circuit diagram of the partial region I of the display panel 10 of FIG. 2. FIG. 4 is a schematic cross-sectional view of the partial region I of the display panel 10 of FIG. 2. Specifically, FIG. 4 corresponds to the cross-sectional line A-A" of FIG. 2. For clarity, FIG. 1 and FIG. 2 omit illustration of the first transistor T1 of FIG. 3 and the first conductive pattern 145, the second conductive pattern 146, the third conductive pattern 155, the fourth conductive pattern 156, and the second transfer pattern 182 in FIG. 4.

Referring to FIG. 1, in the embodiment, the display panel 10 includes a first substrate 100, a plurality of data lines DL, and a plurality of scan lines GL. The plurality of data lines DL and the plurality of scan lines GL are alternately disposed on the first substrate 100. In detail, the plurality of data lines DL are sequentially arranged in the direction D1 and extend in the direction D2; the plurality of scan lines GL are sequentially arranged in the direction D2 and extend in the direction D1. Specifically, in the present embodiment, the direction D1 may be substantially perpendicular to the direction D2, but the disclosure is not limited thereto.

In the embodiment, the display panel 10 further includes a plurality of power lines PL disposed on the first substrate 100. The plurality of power lines PL may have different functions (or may have different signals). For example, in the embodiment, the plurality of power lines PL include a plurality of first power lines PL1 and a plurality of second power lines PL2. The plurality of first power lines PL1 extend in the direction D2 and are alternately arranged in the direction D1 with the plurality of data lines DL. The plurality of second power lines PL2 extend in the direction D1, and are alternately arranged in the direction D2 with the plurality of scan lines GL, but the disclosure is not limited thereto. In this embodiment, the plurality of power lines PL may have different fixed voltage potentials. For example, the first power line PL1 may have a ground voltage level, and the second power line PL2 may have a high voltage level, but the disclosure is not limited thereto. Based on other embodiments, the plurality of power lines PL may also have a floating potential or other suitable type of potential.

In this embodiment, the materials of the first power line PL1 and the data line DL may be selectively the same; that is, the first power line PL1 and the data line DL may be selectively formed on the same film layer, but the disclosure is not limited thereto. Persons having ordinary skill in the art can change the film layer to which the first power line PL1 and the data line DL belong according to the actual layout, the disclosure provides no limitation thereto. In addition, in this embodiment, the materials of the second power line PL2 and the scan line GL may be selectively the same; that is, the second power line PL2 and the scan line GL may be selectively formed on the same film layer, but the disclosure is not limited thereto. Persons having ordinary skill in the art can change the film layer to which the second power line PL2 and the scan line GL belong according to the actual layout, the disclosure provides no limitation thereto. In the present embodiment, for the consideration of conductivity, the materials of the data line DL, the scan line GL, and the power line PL are generally metal materials. However, the disclosure is not limited thereto. Based on other embodiments, other conductive materials such as an alloy, a nitride of a metal material, an oxide of a metal material, an oxynitride of a metal material, or other suitable materials, or a stacked layer of metal material and other conductive material, or other materials with low resistance (or high conductivity) may be used for the data line DL, the scan line GL, and the power line PL.

Referring to FIG. 1, FIG. 2 and FIG. 3, the display panel 10 further includes a plurality of pixel structures PX disposed on the first substrate 100. Specifically, the plurality of pixel structures PX may be arranged in array on the first substrate 100, and each of the pixel structures PX is electrically coupled to a corresponding data line DL and a corresponding scan line GL. For example, in the embodiment, the pixel structure PX includes a first transistor T1 and a second transistor T2. The first transistor T1 has a first end T1a, a second end T1b, and a control end T1c. The control end T1c of the first transistor T1 is electrically coupled to a corresponding scan line GL, and the first end T1a of the first transistor T1 is electrically coupled to a corresponding data line DL. The second transistor T2 has a first end T2a, a second end T2b, and a control end T2c. The second end T1b of the first transistor T1 is electrically coupled to the control end T2c of the second transistor T2. The first end T2a of the second transistor T2 is electrically coupled to the second power line PL2.

Referring to FIG. 3, the first transistor T1 and the second transistor T2 of the pixel structure PX include a source S, a drain D, a gate G, and a semiconductor pattern CH, respectively. Specifically, in the present embodiment, the two sources S of the first transistor T1 and the second transistor T2 have first ends T1a, T2a of the first transistor T1 and the second transistor T2, respectively, and the two drains D of the first transistor T1 and the second transistor T2 have the second ends T1b and T2b of the first transistor T1 and the second transistor T2, respectively. The two gates G of the first transistor T1 and the second transistor T2 are the control ends T1c and T2c of the first transistor T1 and the second transistor T2, respectively. In this embodiment, the first transistor T1 and the second transistor T2 may be a top-gate type thin film transistor (top-gate TFT). However, the disclosure is not limited thereto. Based on other embodiments, the first transistor T1 and the second transistor T2 may also be a bottom-gate type thin film transistor (bottom-gate TFT) or other suitable types of thin film transistors.

In this embodiment, the pixel structure PX may further include a capacitor C1 electrically coupled between the first transistor T1 and the second transistor T2. The capacitor C1 has a first end C1a and a second end C1b, and the first end C1a of the capacitor C1 is electrically coupled to the control end T2c of the second transistor T2, and the second end C1b of the capacitor C1 is electrically coupled to the first end T2a of the second transistor T2. That is to say, each of the pixel structures PX of this embodiment is illustrated with the structure of 2T1C as an example, but the disclosure provides no limitation to the number of the active component (abbreviated T) and the capacitor (abbreviated C) in each of the pixel structures PX. According to other embodiments, each of the pixel structures PX may also be a 1T1C structure, a 3T1C structure, a 3T2C structure, a 4T1C structure, a 4T2C structure, a 5T1C structure, a 5T2C structure, a 6T1C structure, or a 6T2C structure, a 7T2C structure or any other possible structures.

Referring to FIG. 2 and FIG. 3, in the embodiment, the pixel structure PX further includes a light-emitting diode device LED disposed on the first substrate 100. The light-emitting diode device LED has a first end LEDa and a second end LEDb. The first end LEDa of the light-emitting diode device LED is electrically coupled to the second end T2b of the second transistor T2. The second end LEDb of the light-emitting diode device LED is electrically coupled to the first power line PL1. In this embodiment, the light-emitting diode device LED may be a horizontal (micro) light-emitting diode, but the disclosure is not limited thereto. According to other embodiments, the light-emitting diode device LED may also be a vertical (micro) light-emitting diode, a flip-chip (micro) light-emitting diode or an organic (micro) light-emitting diode.

Referring to FIG. 2, in the embodiment, the light-emitting diode device LED of each of the pixel structures PX overlaps a corresponding power line PL. For example, in this embodiment, the second end LEDb of the light-emitting diode device LED may overlap the first power line PL1, and the overlapping area of the light-emitting diode device LED and the first power line PL1 has a width L in the direction D1, and L≥2 μm, but the disclosure is not limited thereto. In this way, under the same pixels per inch (PPI), it is possible to expand the circuit layout area ECD of each pixel structure PX, thereby increasing the design margin of the circuit of the pixel structure PX. For example, in the embodiment, the material of the first power line PL1 overlapping the light-emitting diode device LED may further include a reflective material, such as a metal material having high reflectivity, but the disclosure is not limited thereto.

Referring to FIG. 2 and FIG. 4, in the embodiment, the display panel 10 further includes a buffer layer 105 disposed between the first substrate 100 and the semiconductor pattern CH of the second transistor T2. For example, in this embodiment, the structure of the semiconductor pattern CH may be a single layer or multiple layers; the material of the semiconductor pattern CH may include amorphous silicon, polycrystalline silicon, microcrystalline silicon, mono-crystalline silicon, organic semiconductor material, oxide semiconductor material (e.g., indium-zinc-oxide, indium-gallium-zinc-oxide, or other suitable materials, or a combination thereof), or other suitable materials, or include a dopant in the above materials, or a combination of the above. In this embodiment, the material of the buffer layer 105 may include an oxide of silicon, a nitride of silicon, an oxide of aluminum, or other suitable materials, or a stacked layer of the at least two of the above materials.

In this embodiment, the materials of the scan line GL and the gate G may be selectively the same. That is, the scan line GL and the gate G may be selectively formed on the same film layer. Specifically, the gate G may be regarded as a part of the scan line GL, but the disclosure is not limited thereto. In addition, in this embodiment, the materials of the data line DL, the source S and the drain D may be selectively the same; that is, the data line DL, the source S and the drain D may be selectively formed on the same film layer, but the disclosure is not limited thereto. In the present embodiment, for the consideration of conductivity, the materials of the gate G, the source S and the drain D are generally metal materials. However, the disclosure is not limited thereto. Based on other embodiments, other conductive materials such as an alloy, a nitride of a metal material, an oxide of a metal material, an oxynitride of a metal material, or other suitable materials, or a stacked layer of metal material and other conductive material may be used for the gate G, the source S and the drain D.

In the embodiment, the display panel 10 further includes a first insulating layer 110. The first insulating layer 110 is disposed between the gate G and the semiconductor pattern CH. The first insulating layer 110 may cover portions of the surfaces of the semiconductor pattern CH and the buffer layer 105. Specifically, in the embodiment, the gate G of the second transistor T2 (or the first transistor T1) may be selectively disposed above the semiconductor pattern CH to form a top-gate TFT, but the disclosure is not limited thereto. The display panel 10 may further include a second insulating layer 120. The second insulating layer 120 may cover the gate G, the plurality of scan lines GL, the plurality of second power lines PL2, and a portion of the first insulating layer 110.

In this embodiment, the source S and the drain D of the second transistor T2 are electrically coupled to different two regions of the semiconductor pattern CH, respectively. In detail, the first insulating layer 110 has contacts 110a and 110b overlapping the semiconductor pattern CH, and the second insulating layer 120 has contacts 120a, 120b overlapping the semiconductor pattern CH. The source S of the second transistor T2 is disposed on the second insulating layer 120, and is filled into the contact 120a of the second insulating layer 120 and the contact 110a of the first insulating layer 110 to be electrically coupled to the semiconductor pattern CH of the second transistor T2. The drain D of the second transistor T2 is disposed on the second insulating layer 120, and is filled into the contact 120b of the second insulating layer 120 and the contact 110b of the first insulating layer 110 to be electrically coupled to the semiconductor pattern CH of the second transistor T2.

In this embodiment, the contact 120a of the second insulating layer 120 and the contact 110a of the first insulating layer 110 may be aligned, and the contact 120b of the second insulating layer 120 and the contact 110b of the first insulating layer 110 may be aligned. That is, the contact 110a of the first insulating layer 110 and the contact 120a of the second insulating layer 120 may be formed in the same etching process by using the same mask, and the contact 110b of the first insulating layer 110 and the contact 120b of the second insulating layer 120 may be formed in the same etching process by using the same mask, the disclosure is not limited thereto.

In this embodiment, the second insulating layer 120 further has a contact 120c overlapping the second power line PL2, and the first end T2a of the source S of the second transistor T2 is filled into the contact 120c of the second insulating layer 120 to be electrically coupled to the second power line PL2. In this embodiment, the materials of the first insulating layer 110 and the second insulating layer 120 may be an inorganic material, an organic material, or other suitable materials, wherein the inorganic material is, for example, silicon oxide, silicon nitride, silicon oxynitride, or other suitable materials; the organic material is, for example, a polyimide-based resin, an epoxy-based resin, an acrylic-based resin, or other suitable materials.

In the embodiment, the display panel 10 may further include a planar layer 130 and a third insulating layer 140. The planar layer 130 may cover the source S and the drain D of the second transistor T2 (or the first transistor T1), the plurality of first power lines PL1, and a portion of the second insulating layer 120. The planar layer 130 has an opening 130a located above the drain D of the second transistor T2 and a contact 130b overlapping the first power line PL1. The third insulating layer 140 may cover portions of the surfaces of the planar layer 130 and the drain D of the second transistor T2, and has a contact 140a overlapping the drain D of the second transistor T2 and a contact 140b overlapping the first power line PL1. For example, in the embodiment, the contact 140b of the third insulating layer 140 and the contact 130b of the planar layer 130 may be aligned; that is, the contact 140b of the third insulating layer 140 and the window 130b of the planar layer 130 may be formed in the same etching process by using the same mask, but the disclosure is not limited thereto. In this embodiment, the material of the planar layer 130 includes an inorganic material (for example: silicon oxide, silicon nitride, silicon oxynitride, other suitable materials, or a stacked layer of at least two of the above materials), an organic material, or other suitable materials, or a combination of the above.

In the embodiment, the display panel 10 further includes a first conductive pattern 145 and a second conductive pattern 146. The first conductive pattern 145 is disposed on the third insulating layer 140 and is filled into the contact 140a of the third insulating layer 140 to be electrically coupled to the drain D of the second transistor T2. The second conductive pattern 146 is disposed on the third insulating layer 140, and is filled into the contact 140b of the third insulating layer 140 and the contact 130b of the planar layer 130 to be electrically coupled to the first power line PL1. In the present embodiment, for the consideration of conductivity, the materials of the first conductive pattern 145 and the second conductive pattern 146 are generally metal materials. However, the disclosure is not limited thereto. Based on other embodiments, other conductive materials such as an alloy, a nitride of a metal material, an oxide of a metal material, an oxynitride of a metal material, or other suitable materials, or a stacked layer of metal material and other conductive material, or a material with low resistance (or high conductivity) may be used for the first conductive pattern 145 and the second conductive pattern 146.

In the embodiment, the display panel 10 may further include a fourth insulating layer 150. The fourth insulating layer 150 may cover portions of the surfaces of the first conductive pattern 145, the second conductive pattern 146, and the third insulating layer 140, and has a contact 150a overlapping the first conductive pattern 145 and a contact 150b overlapping the second conductive pattern 146. In this embodiment, the materials of the fourth insulating layer 150 and the third insulating layer 140 may be selectively the same, and the material thereof includes an inorganic material (for example: silicon oxide, silicon nitride, silicon oxynitride, other suitable materials, or a stacked layer of at least two of the above materials), an organic material, or other suitable materials, or a combination thereof, but the disclosure is not limited thereto.

In the embodiment, the display panel 10 may further include a third conductive pattern 155 and a fourth conductive pattern 156. The third conductive pattern 155 is disposed on the fourth insulating layer 150, and is filled into the contact 150a of the fourth insulating layer 150 to be electrically coupled to the first conductive pattern 145. The fourth conductive pattern 156 is disposed on the fourth insulating layer 150, and is filled into the contact 150b of the fourth insulating layer 150 to be electrically coupled to the second conductive pattern 146. In this embodiment, the third conductive pattern 155 and the fourth conductive pattern 156 are, for example, a transparent conductive layer including a metal oxide such as indium-tin-oxide, indium-zinc-oxide, aluminum-tin-oxide, aluminum-zinc-oxide, indium-germanium-zinc-oxide, or other suitable oxide, or a stacked layer of at least two of the foregoing, but the disclosure is not limited thereto. According to other embodiments, the third conductive pattern 155 and the fourth conductive pattern 156 may also adopt other conductive materials, such as: alloys, nitrides of metal materials, oxides of metal materials, oxynitrides of metal materials, or other suitable materials, or a stacked layer of metal material and other conductive materials.

Referring to FIG. 4, the display panel 10 further includes a fixing layer 160 disposed on at least one of the plurality of power lines PL. The fixing layer 160 may cover portions of the surfaces of the third conductive pattern 155, the fourth conductive pattern 156, and the fourth insulating layer 150. For example, in the embodiment, the fixing layer 160 is a patterned adhesive layer, and overlaps the first power line PL1 and the second power line PL2, wherein the material of the adhesive layer includes a phenolic resin, an epoxy resin and so on. However, the disclosure is not limited thereto. According to other embodiments, the fixing layer 160 may also be an insulating layer, and the material of the insulating layer includes an inorganic material (for example: silicon oxide, silicon nitride, silicon oxynitride, other suitable materials, or a stacked layer of at least two of the above materials), an organic material, or other suitable material, or a combination of the above. In addition, the material of the fixing layer 160 may inherently have better electrical insulating properties and may serve to reduce some electrical signal interference.

In the present embodiment, the light-emitting diode device LED of each of the pixel structures PX is disposed on the fixing layer 160 and overlaps the power line PL (for example, the first power line PL1) covered by the fixing layer 160. For example, in the embodiment, the light-emitting diode device LED includes a first type semiconductor layer 171, a second type semiconductor layer 172, and a light emitting layer 173. The first type semiconductor layer 171 is disposed on the fixing layer 160, the second type semiconductor layer 172 is disposed on the first type semiconductor layer 171, and the light emitting layer 173 is disposed between the first type semiconductor layer 171 and the second type semiconductor layer 172. However, the disclosure is not limited thereto.

In the present embodiment, the first type semiconductor layer 171 and the second type semiconductor layer 172 may include a group II-VI material (for example, ZnSe) or a group III-V nitride material (for example, GaN, AlN, InN, InGaN, AlGaN or AlInGaN). For example, in the embodiment, the first type semiconductor layer 171 is, for example, a P-type doped semiconductor layer, and the material of the P-type doped semiconductor layer is, for example, p-GaN, and the second type semiconductor layer 172 is, for example, an N-type doped semiconductor layer, and the material of the N-type doped semiconductor layer is, for example, n-GaN, but the disclosure is not limited thereto. In this embodiment, the structure of the light emitting layer 173 is, for example, a multiple quantum well (MQW) structure, and the MQW structure includes multi-layer InGaN and multi-layer GaN alternately stacked. Through the design of the ratio of indium or gallium in the light emitting layer 173, the light-emitting wavelength range of the light emitting layer 173 may be adjusted, but the disclosure is not limited thereto.

In this embodiment, the light-emitting diode device LED may further include a first electrode 175 and a second electrode 176 disposed on the same side of the second type semiconductor layer 172, that is, the light-emitting diode device LED of the embodiment is a horizontal light-emitting diode, but the disclosure is not limited thereto. In this embodiment, the first electrode 175 is electrically coupled to the first type semiconductor layer 171, and the second electrode 176 is electrically coupled to the second type semiconductor layer 172. Specifically, the first electrode 175 and the second electrode 176 respectively have a first end LEDa and a second end LEDb of the light-emitting diode device LED. In this embodiment, the materials of the first electrode 175 and the second electrode 176 may include an alloy, a nitride of a metal material, an oxide of a metal material, an oxynitride of a metal material, or other suitable material, or a stacked layer of metal material and other conductive materials, or a material with low resistance (or high conductivity). In some embodiments, the material of the first electrode 175 and the second electrode 176 is, for example, a transparent conductive material with low resistance (or high conductivity).

For example, in the embodiment, the fixing layer 160 may further have a contact 160a overlapping the third conductive pattern 155 and a contact 160b overlapping the fourth conductive pattern 156. The display panel 10 may further include a first transfer pattern 181 and the second transfer pattern 182. The first transfer pattern 181 is electrically coupled between the first electrode 175 of the light-emitting diode device LED and the third conductive pattern 155, and the second transfer pattern 182 is electrically coupled between the second electrode 176 of the light-emitting diode device LED and the fourth conductive pattern 156, but the disclosure is not limited thereto. That is, in the embodiment, the first electrode 175 of the light-emitting diode device LED is electrically coupled to the drain D of the second transistor T2 through the first transfer pattern 181, the third conductive pattern 155 and the first conductive pattern 145. The second electrode 176 of the light-emitting diode device LED is electrically coupled to the first power line PL1 through the second transfer pattern 182, the fourth conductive pattern 156 and the second conductive pattern 146.

In this embodiment, the first transfer pattern 181 and the second transfer pattern 182 are, for example, a transparent conductive layer including a metal oxide such as indium-tin-oxide, indium-zinc-oxide, aluminum-tin-oxide, aluminum-zinc-oxide, indium-germanium-zinc-oxide, or other suitable oxide, or a stacked layer of at least two of the above, but the disclosure is not limited thereto. According to other embodiments, the first transfer pattern 181 and the second transfer pattern 182 may also adopt other conductive materials, such as an alloy, a nitride of a metal material, an oxide of a metal material, an oxynitride of a metal material, or other suitable materials, or a stacked layer of metal material and other conductive materials.

Figure 5:
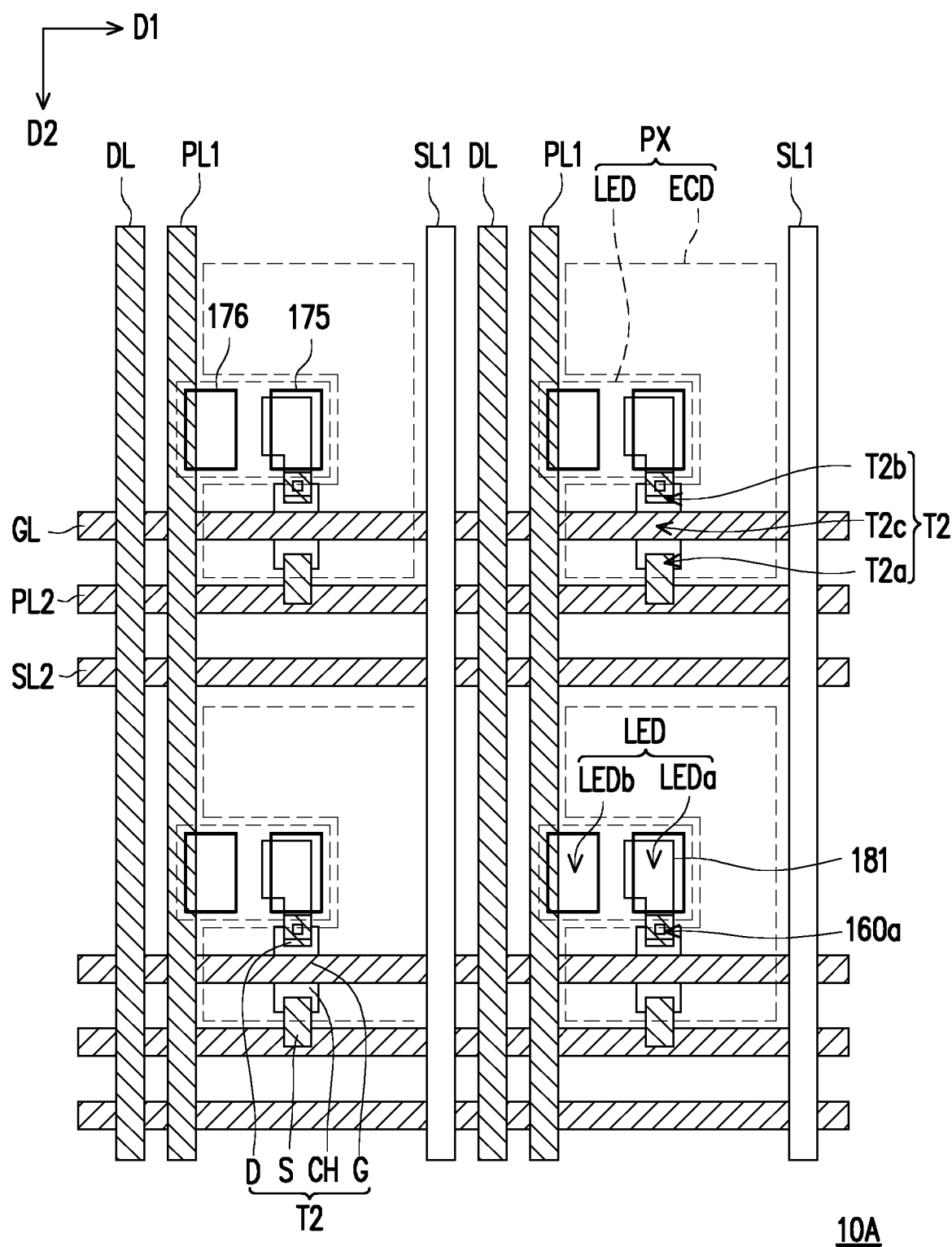
FIG. 5 is a schematic enlargement view of a partial region of a display panel according to the second embodiment of the disclosure.
Figure 6:
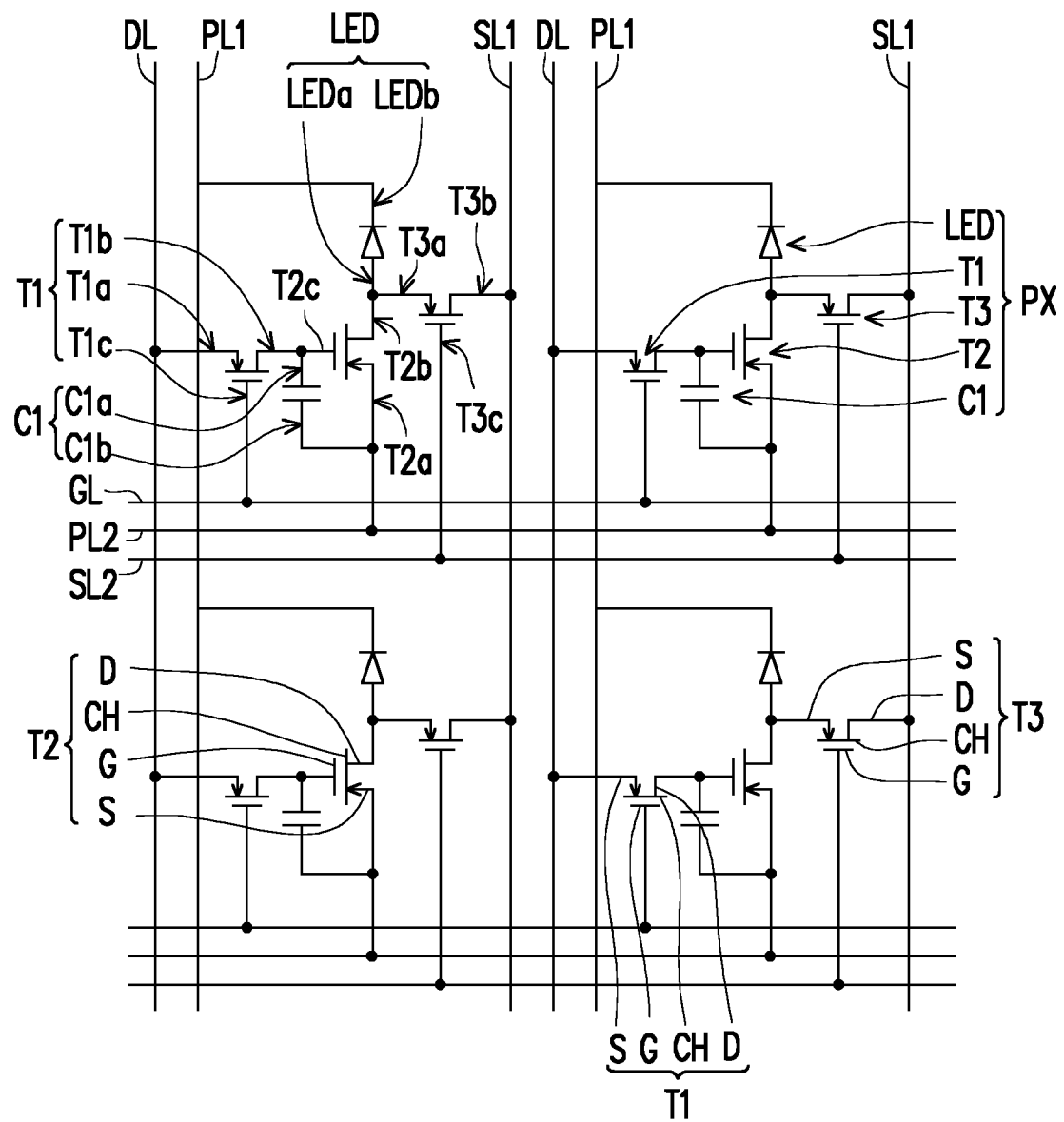
FIG. 6 is a schematic circuit diagram of a partial region of the display panel of FIG. 5.

FIG. 5 is a schematic enlargement view of a partial region of a display panel 10A according to the second embodiment of the disclosure. FIG. 6 is a schematic circuit diagram of a partial region of the display panel 10A of FIG. 5. Specifically, for clarity, FIG. 5 omits the depiction of the first transistor T1, the third transistor T3, and the capacitor C1 in FIG. 6.

Referring to FIG. 5 and FIG. 6, the difference between the display panel 10A of the present embodiment and the display panel 10 of FIG. 2 is that the display panel 10A further includes a plurality of first signal lines SL1 and a plurality of second signal lines SL2. Each of the pixel structures PX further includes a third transistor T3. The third transistor T3 is electrically coupled to a corresponding first signal line SL1 and a corresponding second signal line SL2. That is to say, each of the pixel structures PX of this embodiment is described with the structure of 3T1C as an example, but the disclosure is not limited thereto.

In this embodiment, the plurality of first signal lines SL1, the plurality of data lines DL, and the plurality of first power lines PL1 are alternately arranged in the direction D1, and the plurality of first signal lines SL1 extend in the direction D2. The plurality of second signal lines SL2, the plurality of first scan lines GL1, and the plurality of second power lines PL2 are alternately arranged in the direction D2, and the plurality of second signal lines SL2 extend in the direction D1. In this embodiment, the materials of the first signal line SL1 and the data line DL may be selectively the same; that is, the first signal line SL1 and the data line DL may be selectively formed on the same film layer, but the disclosure is not limited thereto. In addition, in this embodiment, the materials of the second signal line SL2 and the scan line GL may be selectively the same; that is, the second signal line SL2 and the scan line GL may be selectively formed on the same film layer, but the disclosure is not limited thereto.

In the present embodiment, for the consideration of conductivity, the materials of the first signal line SL1 and the second signal line SL2 are generally metal materials. However, the disclosure is not limited thereto. Based on other embodiments, other conductive materials such as an alloy, a nitride of a metal material, an oxide of a metal material, an oxynitride of a metal material, or other suitable materials, or a stacked layer of metal material and other conductive materials may be used for the first signal line SL1 and the second signal line SL2.

Referring to FIG. 6, in the embodiment, the third transistor T3 has a first end T3*a*, a second end T3*b*, and a control end T3*c*. The first end T3*a* of the third transistor T3 is electrically coupled to the first end LEDa of the light-emitting diode device LED and the second end T2*b* of the second transistor T2. The second end T3*b* and the control end T3*c* of the third transistor T3 are electrically coupled to a corresponding first signal line SL1 and a corresponding second signal line SL2, respectively. For example, in the embodiment, the third transistor T3 is used for detecting the input current of the light-emitting diode device LED, and the signal is adjusted by using a compensation circuit disposed in the circuit layout area ECD to enhance the illuminating stability of the light-emitting diode device LED of each of the pixel structures PX, but the disclosure is not limited thereto. In other words, in the present embodiment, through the configuration that the second electrode 176 of the light-emitting diode device LED is partially overlapped with the first power line PL1, the circuit layout area ECD of each of the pixel structures PX is increased, thereby increasing the design margin of the circuit of the pixel structure PX, for example: setting an additional compensation circuit.

Figure 7:
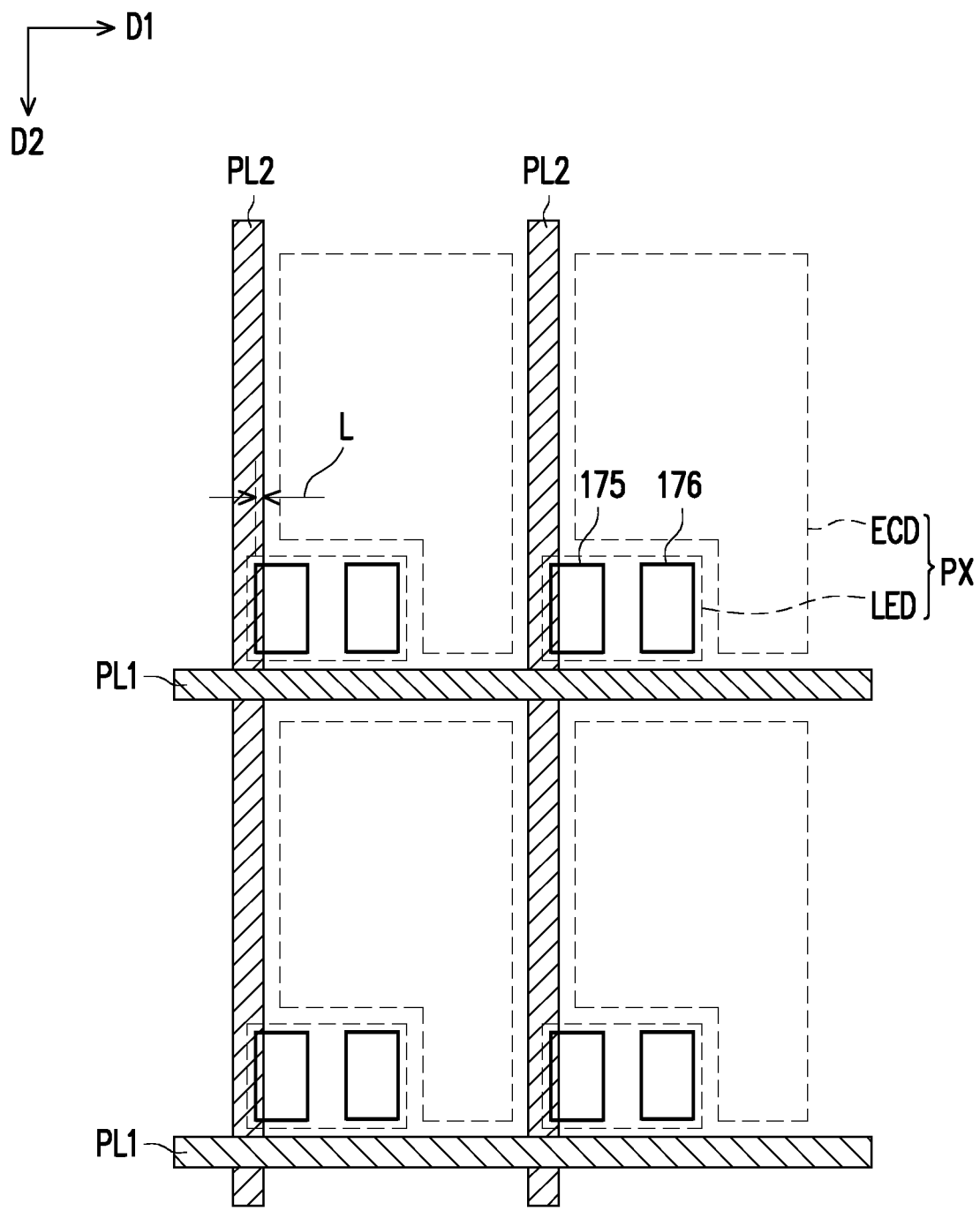
FIG. 7 is a schematic enlargement view of a partial region of a display panel according to the third embodiment of the disclosure.

FIG. 7 is a schematic enlargement view of a partial region of a display panel 10B according to the third embodiment of the disclosure. Specifically, for clarity, FIG. 7 only shows the first power line PL1, the second power line PL2, and the first electrode 175 and the second electrode 176 of the light-emitting diode device LED.

Referring to FIG. 7, the difference between the display panel 10B of the present embodiment and the display panel 10 of FIG. 2 is that the first electrode 175 of the light-emitting diode device LED of each of the pixel structures PX of the display panel 10B overlaps the second power line PL2. In detail, in the embodiment, the plurality of first power lines PL1 are sequentially arranged in the direction D2 and extend in the direction D1; the plurality of second power lines PL2 are sequentially arranged in the direction D1, and extend in the direction D2. For example, in the present embodiment, the overlapping area of the first electrode 175 of the light-emitting diode device LED and the second power line PL2 has a width L in the direction D1, and L≥2 μm, but the disclosure is not limit thereto. In this way, under the same PPI, the circuit layout area ECD of each of the pixel structures PX can be expanded, thereby increasing the design margin of the circuit of the pixel structure PX.

Figure 8:
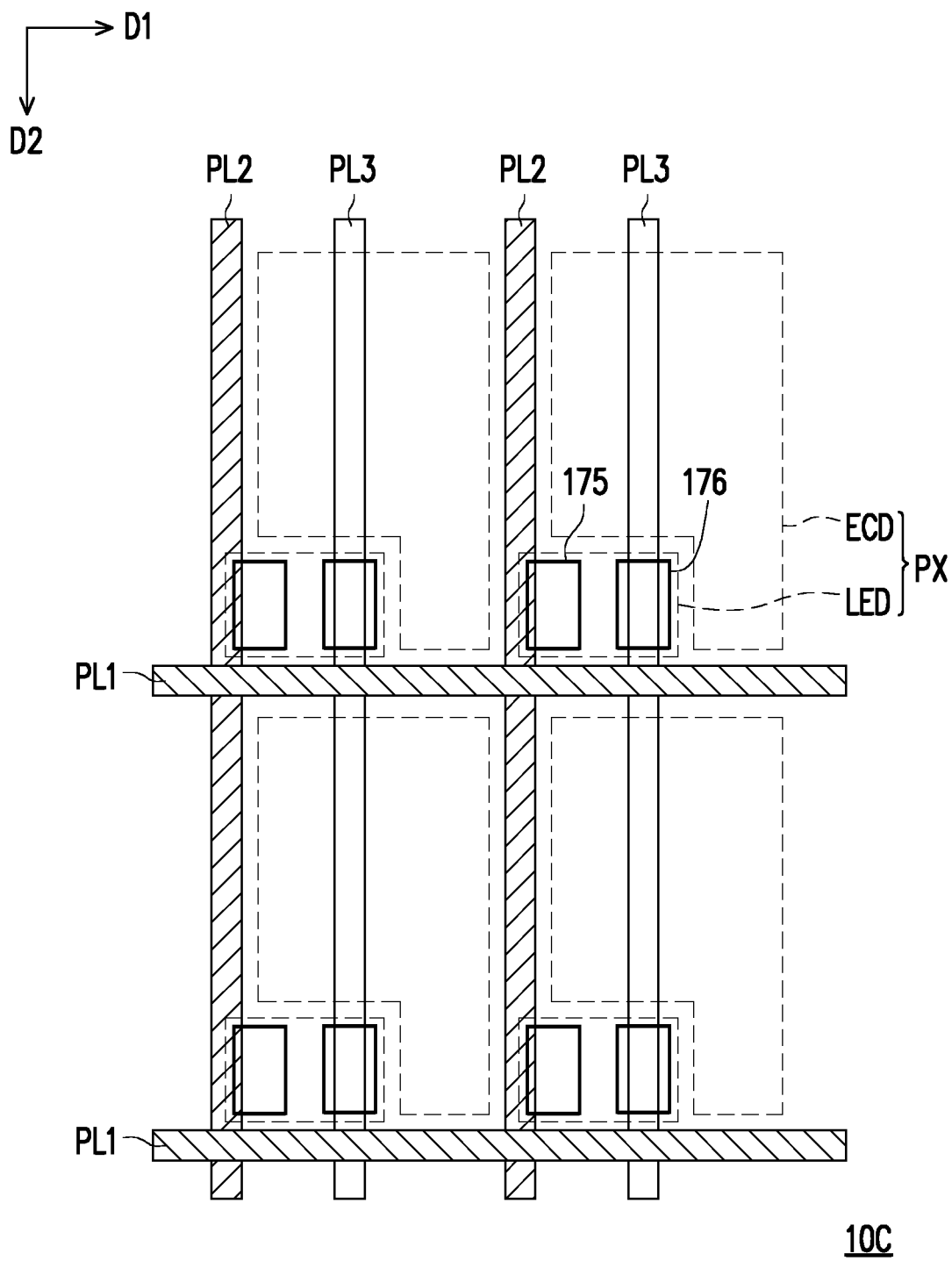
FIG. 8 is a schematic enlargement view of a partial region of a display panel according to the fourth embodiment of the disclosure.

FIG. 8 is a schematic enlargement view of a partial region of a display panel 10C according to the fourth embodiment of the disclosure. Specifically, for clarity, FIG. 8 only shows the first power line PL1, the second power line PL2, the third power line PL3, and the first electrode 175 and the second electrode 176 of the light-emitting diode device LED.

Referring to FIG. 8, the display panel 10C of the present embodiment is different from the display panel 10B of FIG. 7 in that the first electrode 175 and the second electrode 176 of the light-emitting diode device LED of each of the pixel structures PX may respectively overlap two power lines PL. For example, the plurality of power lines PL of the display panel 10C may further include a plurality of third power lines PL3, wherein the plurality of third power lines PL3 and the plurality of second power lines PL2 are alternately arranged in the direction D1, and the plurality of third power lines PL3 extend in the direction D2; the first electrode 175 and the second electrode 176 of the light-emitting diode device LED of each of the pixel structures PX may respectively overlap a corresponding second power line PL2 and a corresponding third power line PL3. In this way, under the same PPI, the circuit layout area ECD of each of the pixel structures PX can be expanded, thereby increasing the design margin of the circuit of the pixel structure PX. In this embodiment, the materials of the third power line PL3 and the second power line PL2 may be selectively the same; that is, the third power line PL3 and the second power line PL2 may be selectively formed on the same film layer. However, the disclosure is not limited thereto. According to other embodiments, the third power line PL3, the first power line PL1, and the second power line PL2 may be formed on different film layers, respectively.

Figure 9:
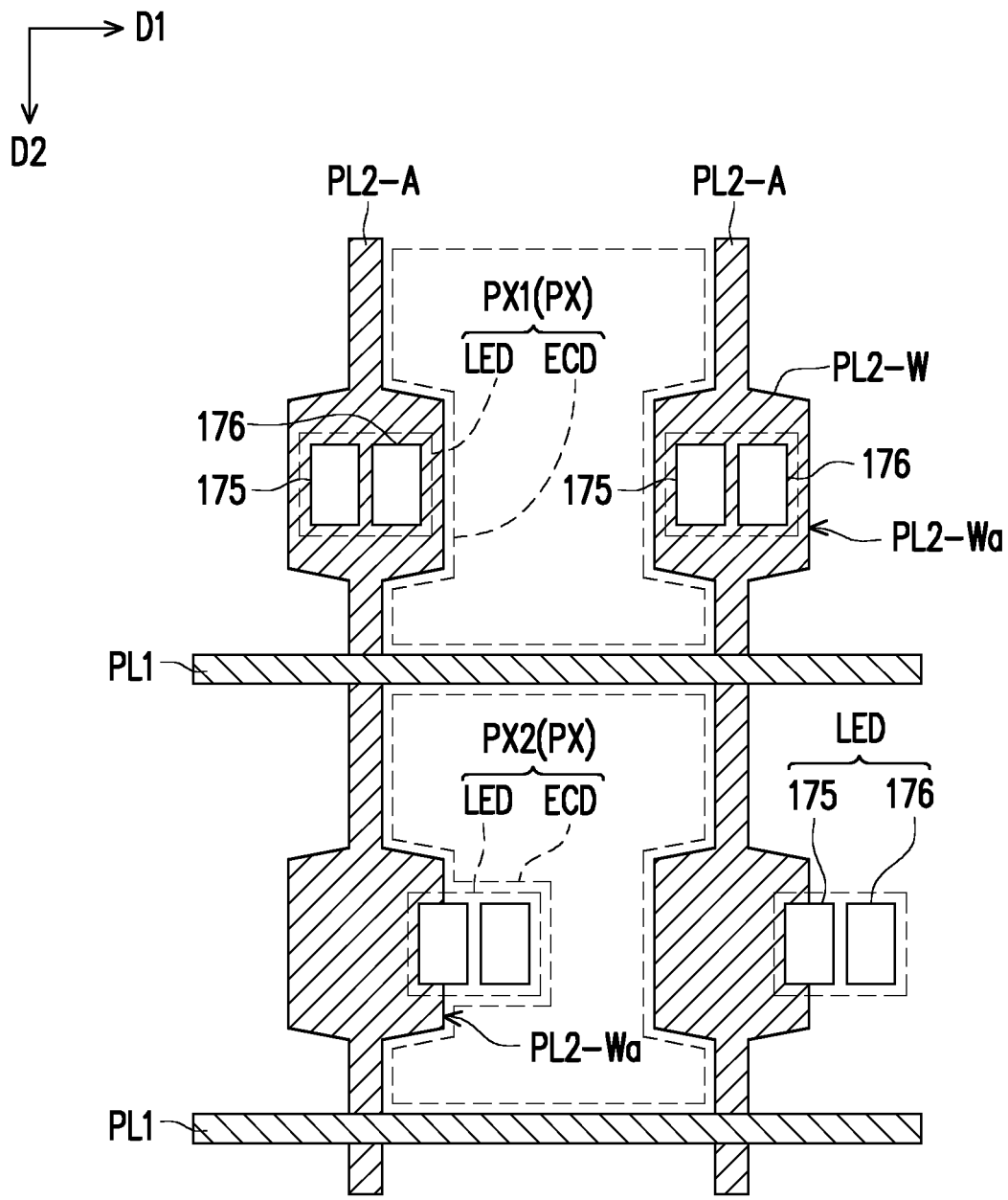
FIG. 9 is a schematic enlargement view of a partial region of a display panel according to the fifth embodiment of the disclosure.

FIG. 9 is a schematic enlargement view of a partial region of a display panel 20 according to the fifth embodiment of the disclosure. Referring to FIG. 9, the difference between the display panel 20 of the present embodiment and the display panel 10B of FIG. 7 is that the second power line PL2-A of the display panel 20 has a wide portion PL2-W and the light-emitting diode device LED of the pixel structure PX overlaps the wide portion PL2-W of the second power line PL2-A.

In this embodiment, part of the pixel structure PX may completely overlap the wide portion PL2-W of the second power line PL2-A, and another part of the pixel structure PX may partially overlap the wide portion PL2-W of the second power line PL2-A. For example, the wide portion PL2-W of the second power line PL2-A has an edge PL2-Wa, and the plurality of pixel structures PX electrically coupled to the same second power line PL2-A includes a pixel structure PX1 and a pixel structure PX2. Specifically, the vertical projection of the light-emitting diode device LED of the pixel structure PX1 may be completely located within the edge PL2-Wa of the wide portion PL2-W of the second power line PL2-A (that is, the light-emitting diode device LED of the pixel structure PX1 may completely overlap the wide portion PL2-W of the second power line PL2-A). A part of the first electrode 175 of the light-emitting diode device LED of the pixel structure PX2 is located within the edge PL2-Wa of the wide portion PL2-W of the second power line PL2-A. Another portion of the first electrode 175 of the light-emitting diode device LED of the pixel structure PX2 and the second electrode 176 are located outside the edge PL2-Wa of the wide portion PL2-W of the second power line PL2-A (that is, the light-emitting diode device LED of the pixel structure PX2 may partially overlap the wide portion PL2-W of the second power line PL2-A), but the disclosure is not limited thereto.

Figure 10:
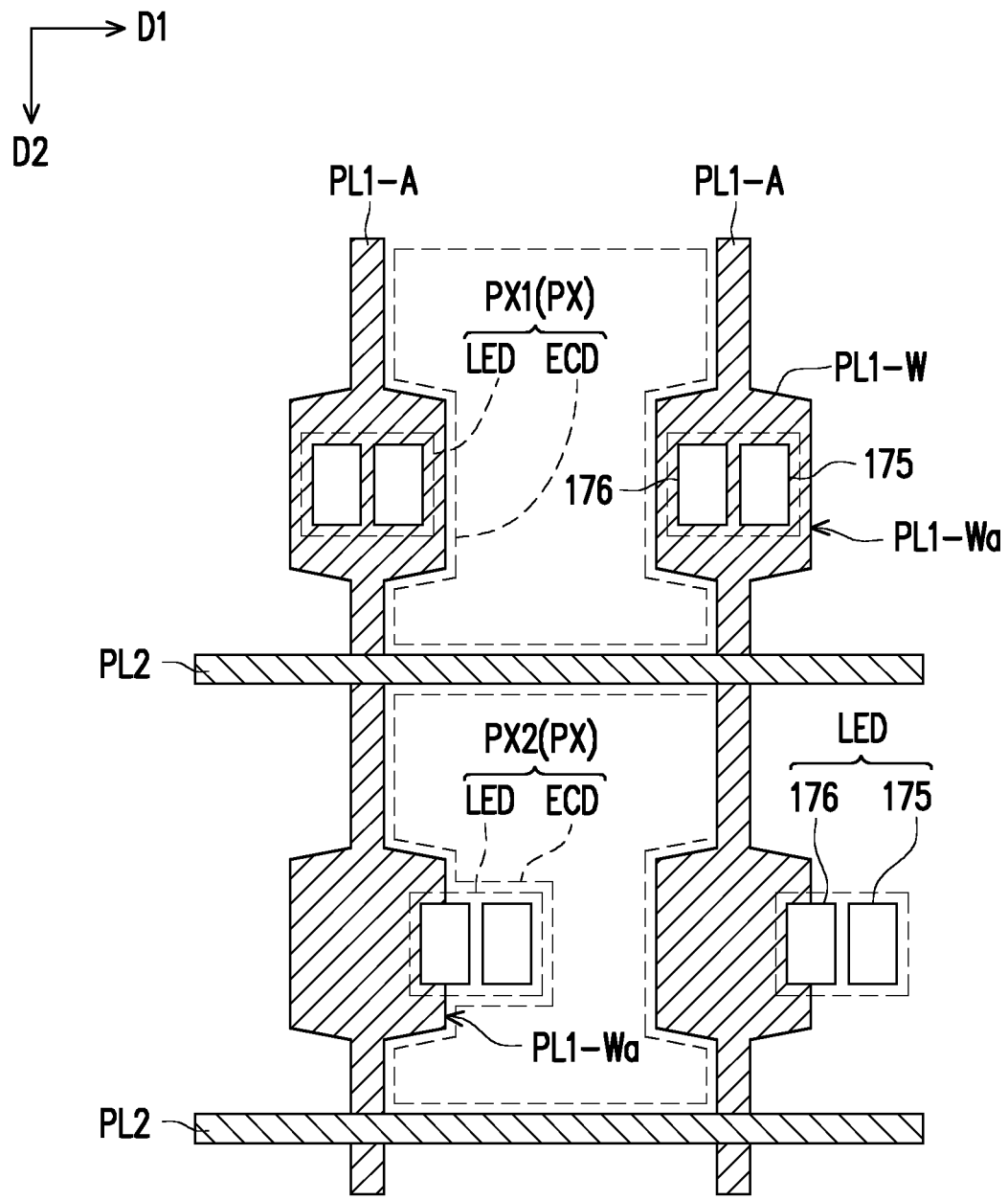
FIG. 10 is a schematic enlargement view of a partial region of a display panel according to the sixth embodiment of the disclosure.

FIG. 10 is a schematic enlargement view of a partial region of a display panel 20A according to the sixth embodiment of the disclosure. Referring to FIG. 10, the difference between the display panel 20A of the present embodiment and the display panel 20 of FIG. 9 is that the first power line PL1-A of the display panel 20A extends in the direction D2, and the first power line PL1-A has a wide portion PL1-W.

In the present embodiment, the wide portion PL1-W of the first power line PL1-A has the edge PL1-Wa. The plurality of pixel structures PX electrically coupled to the same first power line PL1-A includes a pixel structure PX1 and a pixel structure PX2. For example, in the present embodiment, the vertical projection of the light-emitting diode device LED of the pixel structure PX1 is located within the edge PL1-Wa of the wide portion PL1-W of the first power line PL1-A; that is, the light-emitting diode device LED completely overlaps the wide portion PL1-W of the first power line PL1-A, but the disclosure is not limited thereto. For example, in the present embodiment, a portion of the first electrode 175 of the light-emitting diode device LED of the pixel structure PX2 is located within the edge PL1-Wa of the wide portion PL1-W of the first power line PL1-A, and another portion of the first electrode 175 of the light-emitting diode device LED of the pixel structure PX2 and the second electrode 176 are located outside the edge PL1-Wa of the wide portion PL1-W of the first power line PL1-A (that is, the light-emitting diode device LED of the pixel structure PX2 may partially overlap the wide portion PL1-W of the first power line PL1-A), but the disclosure is not limited thereto.

Figure 11:
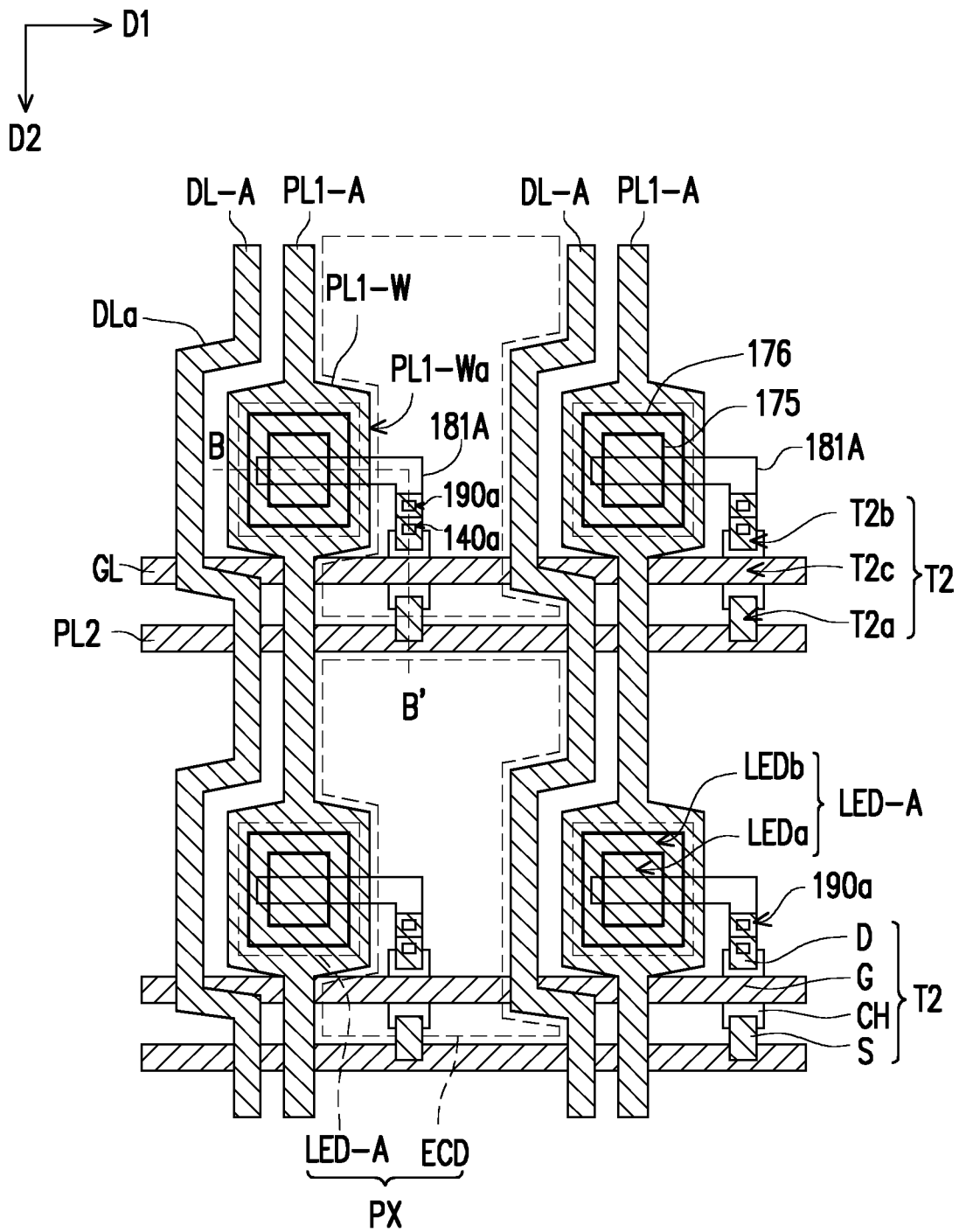
FIG. 11 is a schematic enlargement view of a partial region of a display panel according to the seventh embodiment of the disclosure.
Figure 12:
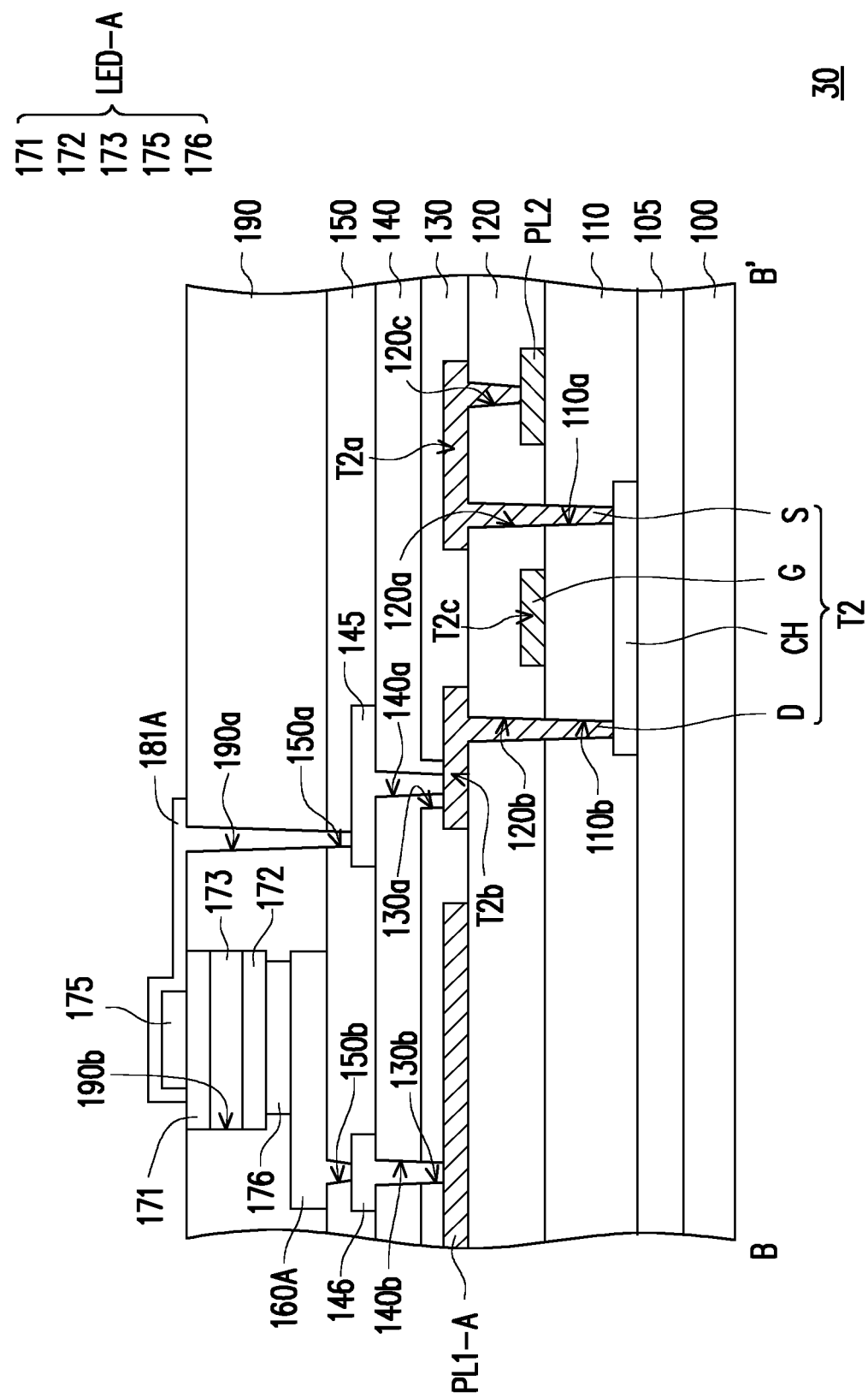
FIG. 12 is a schematic cross-sectional view of a partial region of the display panel of FIG. 11.

FIG. 11 is a schematic enlargement view of a partial region of a display panel 30 according to the seventh embodiment of the disclosure. FIG. 12 is a schematic cross-sectional view of a partial region of the display panel 30 of FIG. 11. Specifically, FIG. 12 corresponds to the cross-sectional line B-B' of FIG. 11. For clarity, FIG. 11 omits the depiction of the first conductive pattern 145, the second conductive pattern 146, and the fixing layer 160A of FIG. 12.

Referring to FIG. 11, the difference between the display panel 30 of the present embodiment and the display panel 20A of FIG. 10 is that the light-emitting diode device LED-A of the pixel structure PX of the display panel 30 is a vertical light-emitting diode, and overlaps the wide portion PL1-W of the first power line PL1-A. The plurality of data lines DL-A have a zigzag segment DLa conforming to the wide portion PL1-A of the first power line PL1-A.

Specifically, in the present embodiment, the wide portion PL1-W of the first power line PL1-A has the edge PL1-Wa, and the vertical projection of the light-emitting diode device LED-A is located within the edge PL1-Wa of the wide portion PL1-W of the first power line PL1-A. That is, the light-emitting diode device LED-A is completely overlapped with the wide portion PL1-W of the first power line PL1-A. In this manner, under the same PPI, the circuit layout area ECD of each of the pixel structures PX can be expanded, thereby increasing the design margin of the circuit of the pixel structure PX. For example, in the present embodiment, each of the data lines DL-A has a zigzag segment DLa conforming to the wide portion PL1-W of the first power line PL1-A, and is adjacent to the first power line PL1-A in parallel, but the disclosure is not limited thereto. According to other embodiments, each of the scan lines GL may have a zigzag segment conforming to the wide portion PL1-W of the first power line PL1-A, and is adjacent to the first power line PL1-A in parallel.

Referring to FIG. 11 and FIG. 12, as compared with the fixing layer 160 of the display panel 10 of the first embodiment, the fixing layer 160A of the present embodiment is a patterned conductive layer and overlaps only the first power line PL1-A. In this embodiment, the fixing layer 160A is electrically coupled to the second conductive pattern 146 through the contact 150b of the fourth insulating layer 150. For example, in this embodiment, the first electrode 175 and the second electrode 176 of the light-emitting diode device LED-A are respectively located on opposite sides of the light emitting layer 173, and the second electrode 176 is disposed between the first electrode 175 and the fixing layer 160A; that is, the light-emitting diode device LED-A is a vertical light-emitting diode. However, the disclosure is not limited thereto, and according to other embodiments, the light-emitting diode device LED-A may also be a flip chip LED. In detail, in this embodiment, the second electrode 176 of the light-emitting diode device LED-A may be selectively directly connected to the fixing layer 160A and electrically coupled to the first power line PL1-A through the second conductive pattern 146, but the disclosure is not limited thereto.

Referring to FIG. 12, in the embodiment, the display panel 30 may further include a fifth insulating layer 190. The fifth insulating layer 190 may cover portions of the surfaces of the fixing layer 160A and the fourth insulating layer 150, and has a contact 190a overlapping the first conductive pattern 145 and an opening 190b overlapping the fixing layer 160A. In detail, the first transfer pattern 181A is filled into the contact 190a of the fifth insulating layer 190 to be electrically coupled to the first conductive pattern 145, and the second electrode 176 of the light-emitting diode device LED-A, the second type semiconductor layer 172, the light emitting layer 173 and the first type semiconductor layer 171 are sequentially stacked within the opening 190b of the fifth insulating layer 190. In this embodiment, the material of the fifth insulating layer 190 includes an inorganic material (for example, silicon oxide, silicon nitride, silicon oxynitride, other suitable material, or a stacked layer of at least two of the above materials), an organic material, or other suitable materials, or a combination of the foregoing.

Figure 13:
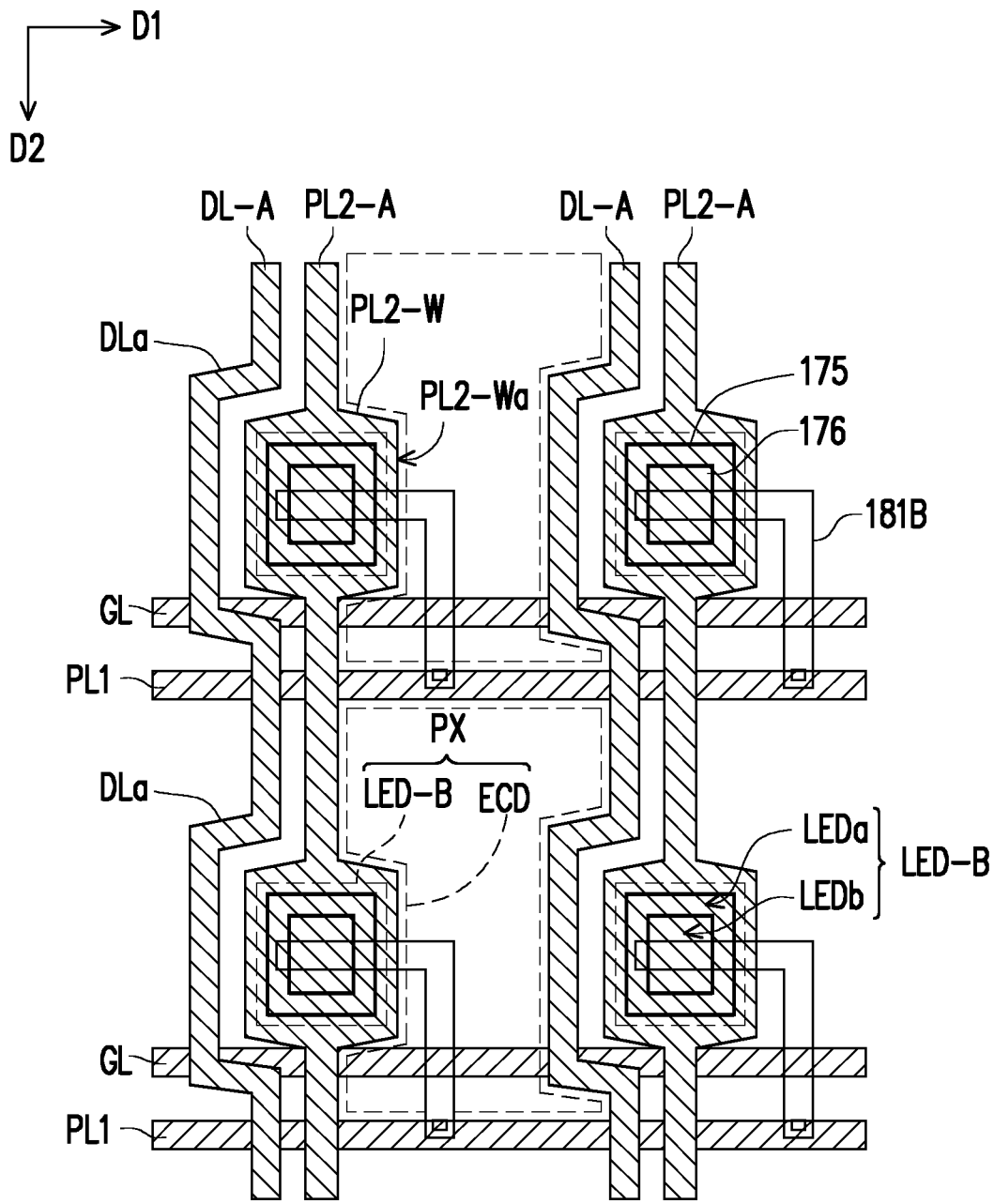
FIG. 13 is a schematic enlargement view of a partial region of a display panel according to the eighth embodiment of the disclosure.

FIG. 13 is a schematic enlargement view of a partial region of a display panel 30A according to the eighth embodiment of the disclosure. Referring to FIG. 13, the difference between the display panel 30A of the present embodiment and the display panel 30 of FIG. 11 is that the second power line PL2-A of the display panel 30A extends in the direction D2 and has a wide portion PL2-W. The light-emitting diode device LED-B is disposed on the wide portion PL2-W of the second power line PL2-A, and the first electrode 175 of the light-emitting diode device LED-B is disposed between the second power line PL2-A and the second electrode 176.

In detail, in the embodiment, the second electrode 176 of the light-emitting diode device LED-B may be electrically coupled to the first power line PL1 through the first transfer pattern 181B, but the disclosure is not limited thereto. For example, in this embodiment, the materials of the first power line PL1 and the scan line GL may be selectively the same; that is, the first power line PL1 and the scan line GL may be selectively formed on the same film layer. However, the disclosure is not limited thereto. For example, in this embodiment, the materials of the second power line PL2-A and the data line DL-A may be selectively the same; that is, the second power line PL2-A and the data line DL-A may be selectively formed on the same film layer, but the disclosure is not limited thereto.

Figure 14:
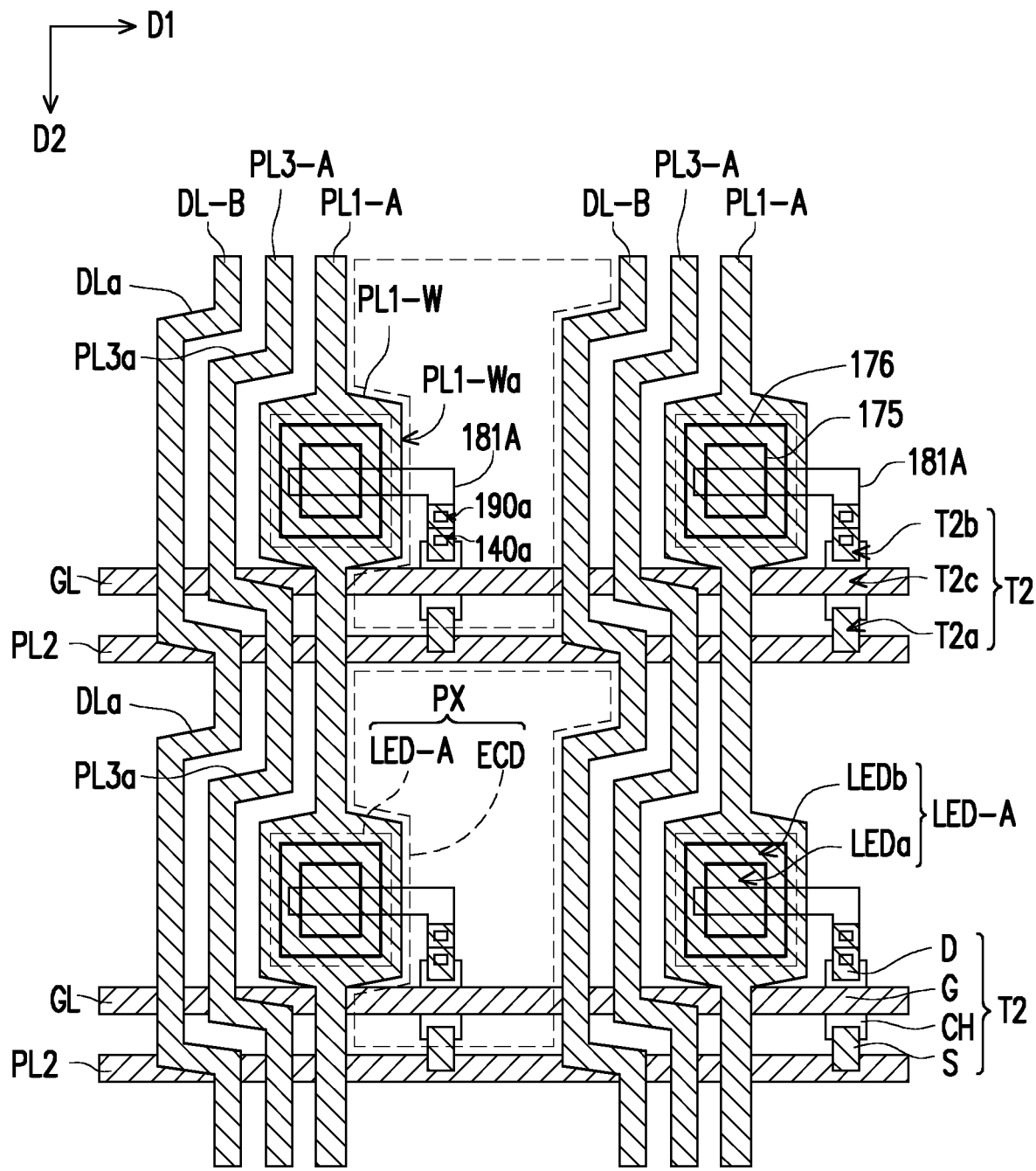
FIG. 14 is a schematic enlargement view of a partial region of a display panel according to the ninth embodiment of the disclosure.

FIG. 14 is a schematic enlargement view of a partial region of a display panel 30B according to the ninth embodiment of the disclosure. Referring to FIG. 14, the difference between the display panel 30B of the present embodiment and the display panel 30 of FIG. 11 is that the display panel 30B may further include a plurality of third power lines PL3-A. The plurality of data lines DL-A, the plurality of third power lines PL3-A, and the plurality of first power lines PL1-A are alternately arranged in the direction D1 and extend in the direction D2 respectively; specifically, the third power line PL3-A is disposed between the data line DL-B and the first power line PL1-A.

In the present embodiment, the third power line PL3-A may have a zigzag segment PL3a conforming to the wide portion PL1-W of the first power line PL1-A, and is adjacent to the first power line PL1-A in parallel. For example, in this embodiment, the materials of the third power line PL3-A, the first power line PL1-A, and the data line DL-B may be selectively the same; that is, the third power line PL3-A, the first power line PL1-A and the data line DL-B may be selectively formed on the same film layer, but the disclosure is not limited thereto.

Figure 15:
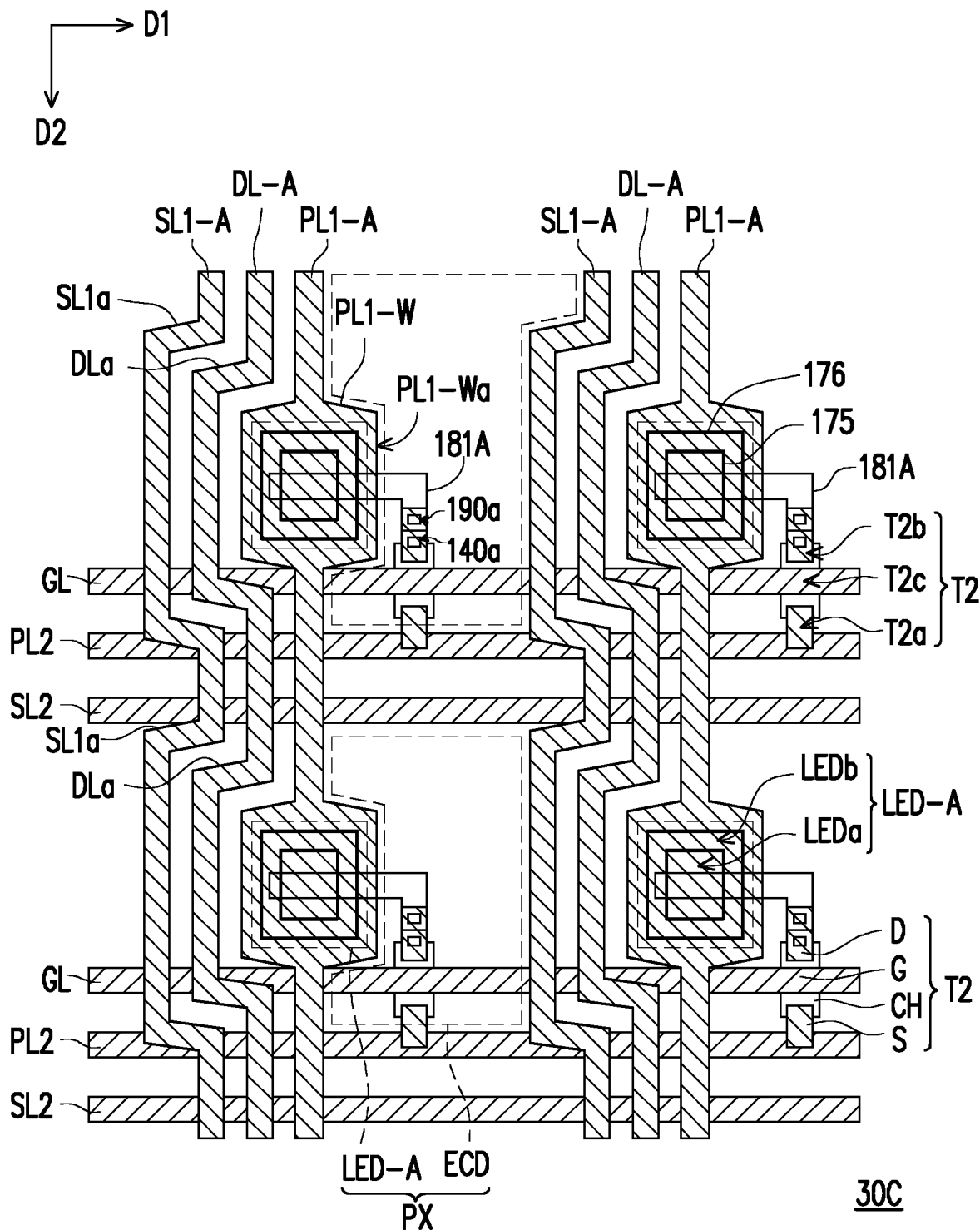
FIG. 15 is a schematic enlargement view of a partial region of a display panel according to the tenth embodiment of the disclosure.
Figure 16:
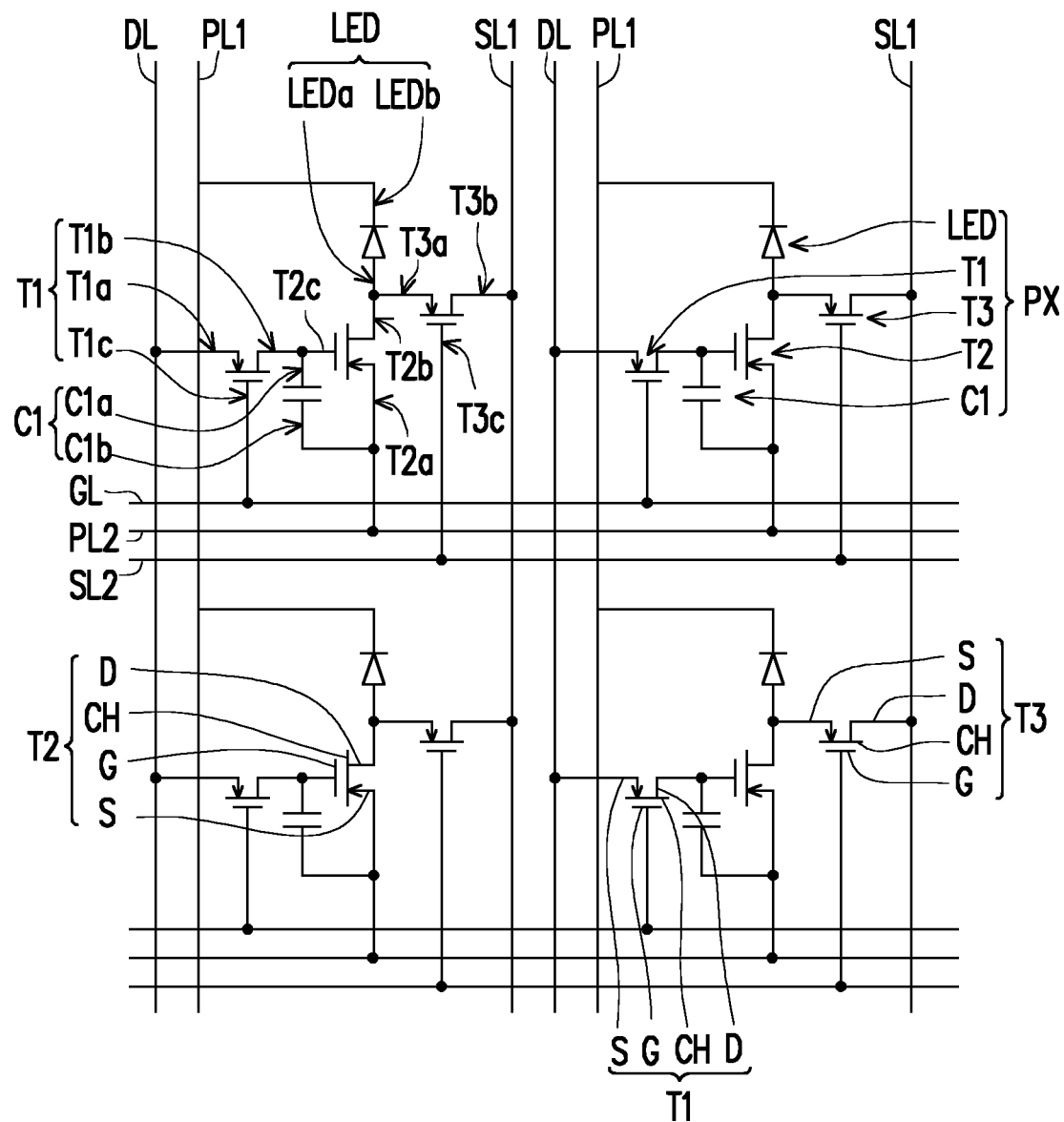
FIG. 16 is a schematic circuit diagram of a partial region of the display panel of FIG. 15.

FIG. 15 is a schematic enlargement view of a partial region of a display panel 30C according to the tenth embodiment of the disclosure. FIG. 16 is a cover schematic circuit diagram of a partial region of the display panel 30C of FIG. 15. Specifically, for clarity, FIG. 15 omits the depiction of the first transistor T1, the third transistor T3, and the capacitor C1 in FIG. 16.

Referring to FIG. 15 and FIG. 16, the display panel 30C of the present embodiment differs from the display panel 30 of FIG. 11 in that the display panel 30C further includes a plurality of first signal lines SL1-A and a plurality of second signal lines SL2. Each of the pixel structures PX further includes a third transistor T3. The third transistor T3 is electrically coupled to a corresponding first signal line SL1 and a corresponding second signal line SL2. Since the configuration relationship of the third transistor T3, the first signal line SL1-A, and the second signal line SL2 of the present embodiment is similar to that of the display panel 10A of the second embodiment described above, related descriptions are omitted herein. For the omitted descriptions, reference may be derived from the aforementioned second embodiment.

In this embodiment, the first signal line SL1-A may have a zigzag segment SL1a conforming to the wide portion PL1-W of the first power line PL1-A, and is adjacent to the first power line PL1-A in parallel. However, the disclosure is not limited thereto. According to other embodiments, the second power line PL2 may also have a zigzag segment conforming to the wide portion PL1-W of the first power line PL1-A, and is adjacent to the first power line PL1-A in parallel.

Figure 17:
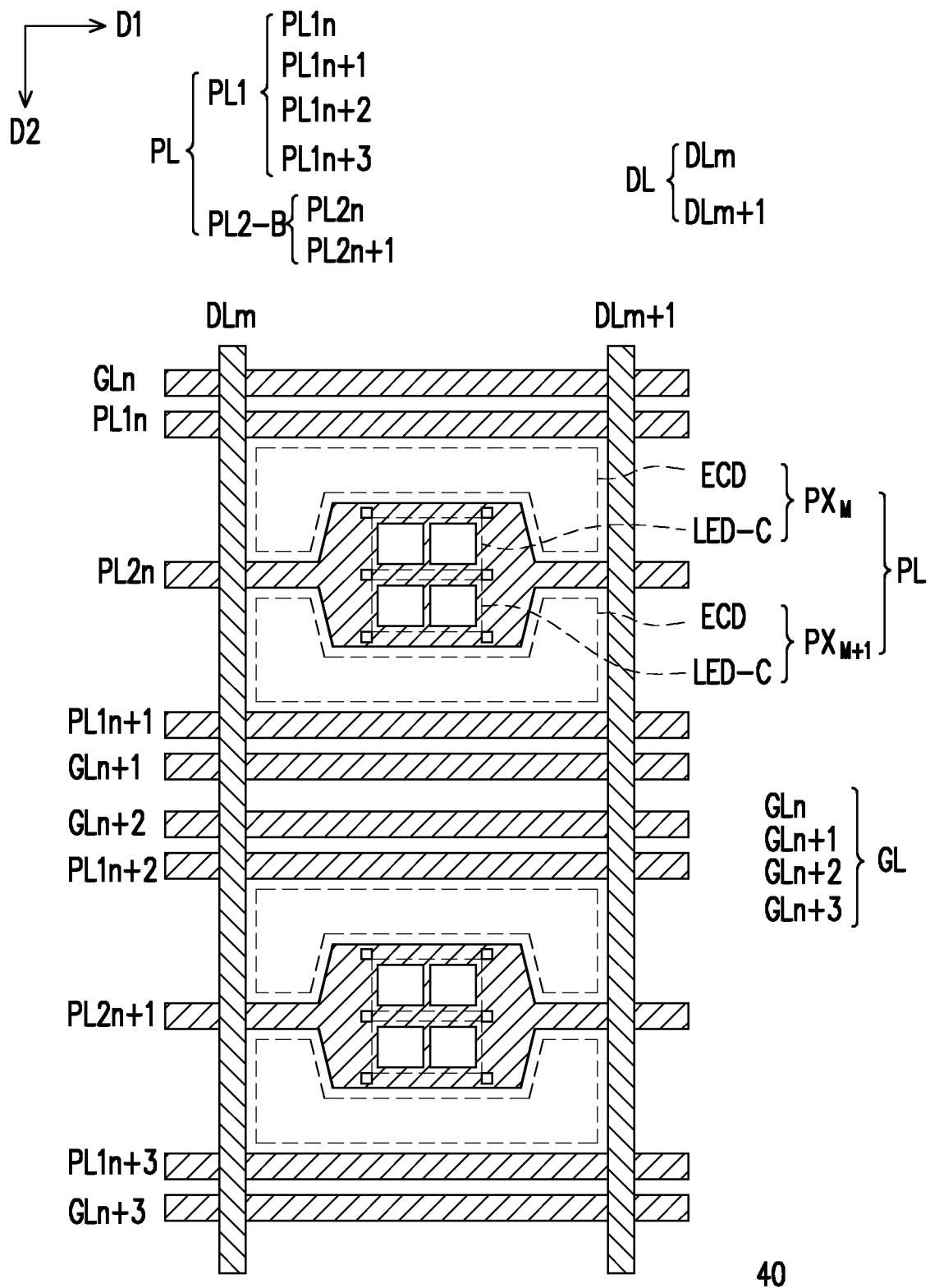
FIG. 17 is a schematic enlargement view of a partial region of a display panel according to the eleventh embodiment of the disclosure.
Figure 18:
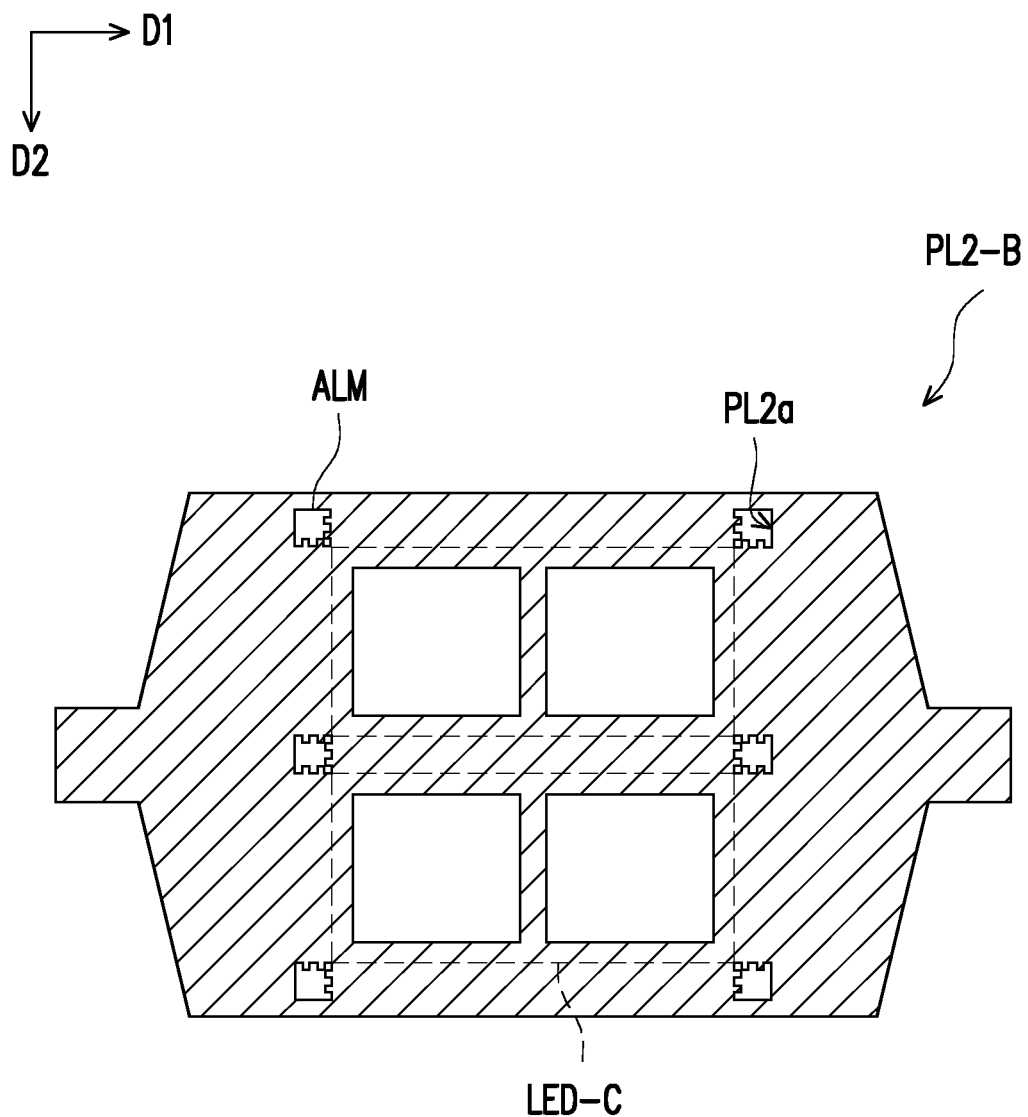
FIG. 18 is a schematic enlargement view of a partial region of a second power line of the display panel of FIG. 17.

FIG. 17 is a schematic enlargement view of a partial region of a display panel 40 according to the eleventh embodiment of the disclosure. FIG. 18 is a schematic enlargement view of a partial region of a second power line PL2-A of the display panel 40 of FIG. 17.

Referring to FIG. 17, in the embodiment, the plurality of first power lines PL1, the plurality of second power lines PL2-B, and the plurality of scan lines GL of the display panel 40 are alternately arranged in the direction D2 and extend in the direction D1. The plurality of pixel structures PX include an Mth pixel structure $PX_M$ and an M+1th pixel structure $PX_{M+1}$ which are sequentially arranged in the direction D2. Specifically, in the present embodiment, the second power line PL2-B has a wide portion PL2-W, and the light-emitting diode device LED-C of the Mth pixel structure $PX_M$ and the light-emitting diode device LED-C of the M+1th pixel structure $PX_{M+1}$ are disposed on the same wide portion PL2-W of a corresponding second power line PL2-B. In this manner, under the same PPI, the circuit layout area ECD of each of the pixel structures PX may be expanded, thereby increasing the design margin of the circuit of the pixel structure PX.

For example, in this embodiment, the vertical projection of the light-emitting diode device LED-C of the Mth pixel structure $PX_M$ and the vertical projection of the light-emitting diode device LED-C of the M+1th pixel structure $PX_{M+1}$ are located within the vertical projection area of the wide portion PL2-W of the second power line PL2-A and do not overlap each other. However, the disclosure is not limited thereto. According to other embodiments, a part of the vertical projection of the light-emitting diode device LED-C of the Mth pixel structure $PX_M$ may be located within the vertical projection area of the wide portion PL2-W of the second power line PL2-B, and another portion of the vertical projection of the light-emitting diode device LED-C of the Mth pixel structure $PX_M$ may be located outside the vertical projection area of the wide portion PL2-W of the second power line PL2-B.

Referring to FIG. 17 and FIG. 18, in the embodiment, the wide portion PL2-W of the second power line PL2-B may have an alignment pattern ALM, but the disclosure is not limited thereto. According to other embodiments, the wide portion of the first power line PL1 may also have an alignment pattern ALM. For example, in the embodiment, the alignment pattern ALM includes a plurality of openings PL2a, and the vertical projection of each of the openings PL2a does not overlap the vertical projection of the light-emitting diode device LED-C, but the disclosure is not limited thereto. In this embodiment, the materials of the first power line PL1, the second power line PL2-B, and the scan line GL may be selectively the same; that is, the first power line PL1, the second power line PL2-B, and the scan line GL may be selectively formed on the same film layer, but the disclosure is not limited thereto. The formation of the alignment pattern ALM may be used for transfer alignment of the light-emitting diode device LED-C, which not only can expand the circuit layout area ECD of each of the pixel structures PX under the same PPI, thereby increasing the design margin of the circuit of the pixel structure PX, but also can improve the yield rate of the transfer process.

In summary, in the display panel of the embodiment of the disclosure, through the configuration that the light-emitting diode device of the pixel structure overlaps the power line provided with the fixing layer, the circuit layout space of the pixel structure is increased, thereby enhancing the design margin of circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
a plurality of data lines and a plurality of scan lines;
a plurality of pixel structures, each of the pixel structures comprising:
a first transistor, having a first end, a second end, and a control end, wherein the control end of the first transistor is electrically coupled to a corresponding scan line and the first end of the first transistor is electrically coupled to a corresponding data line;
a second transistor, having a first end, a second end, and a control end, wherein the second end of the first transistor is electrically coupled to the control end of the second transistor; and
a light-emitting diode device, having a first end and a second end, wherein the first end of the light-emitting diode device is electrically coupled to the second end of the second transistor;
a plurality of power lines, electrically coupled to a first end of a second transistor of at least one pixel structure and a second end of an light-emitting diode device of the at least one pixel structure respectively; and
a fixing layer, disposed on at least one of the power lines, wherein the light-emitting diode device of the at least one pixel structure is disposed on the fixing layer and overlaps the at least one of the power lines;
wherein the light-emitting diode device overlapping the at least one of the power lines comprises:
a first type semiconductor layer, electrically connected to the first end of the light-emitting diode device;
a second type semiconductor layer, electrically connected to the second end of the light-emitting diode device;
a light emitting layer, disposed between the first type semiconductor layer and the second type semiconductor layer;
wherein the first end of the light-emitting diode device and the second end of the light-emitting diode device are located on a single side of the second type semiconductor layer or respectively located on opposite sides of the light emitting layer.

2. The display panel according to claim 1, wherein the power line of the light-emitting diode device overlapping the at least one pixel structure has a fixed voltage potential.

3. The display panel according to claim 1, wherein a material of the power line overlapping the light-emitting diode device of the at least one pixel structure comprises an optical reflective material.

4. The display panel according to claim 1, wherein the power line overlapping the light-emitting diode device of the at least one pixel structure extends in a first direction, an overlapping area of the light-emitting diode device and the power line has a width L in a second direction, L≥2 μm, and the first direction is interlaced with the second direction.

5. The display panel according to claim 1, wherein the first end of the light-emitting diode device and the second end of the light-emitting diode device are located on opposite sides of the light emitting layer, the second end of the light-emitting diode device is located between the first end of the light-emitting diode device and the fixing layer, and the second end of the light-emitting diode device is electrically coupled to the at least one of the power lines.

6. The display panel according to claim 1, wherein the at least one of the power lines overlapping the at least one light-emitting diode device has a wide portion, the at least one light-emitting diode device overlaps the wide portion, and one of the data lines and the scan lines has a zigzag segment conforming to the wide portion and is adjacent to the power line in parallel.

7. The display panel according to claim 1, wherein the at least one of the power lines overlapping the at least one light-emitting diode device has a wide portion, the at least one light-emitting diode device overlaps the wide portion, and another one of the power lines has a zigzag segment conforming to the wide portion and is adjacent to the at least one of the power lines in parallel.

8. The display panel according to claim 1, wherein the first end of the light-emitting diode device and the second end of the light-emitting diode device are located on a single side of the second type semiconductor layer, and the light-emitting diode device partially overlaps the at least one of the power lines.

9. The display panel according to claim 8, wherein the second end of the light-emitting diode device overlaps the at least one of the power lines in a vertical projection direction.

10. The display panel according to claim 9, wherein the first end of the light-emitting diode device overlaps another power line of the power lines in a vertical projection direction.

11. The display panel according to claim 1, wherein the at least one of the power lines has at a wide portion, and the light-emitting diode device of the at least one pixel structure overlaps the wide portion.

12. The display panel according to claim 11, wherein a vertical projection of the light-emitting diode device is located within an edge of the wide portion.

13. The display panel according to claim 11, wherein a portion of a vertical projection of the light-emitting diode device is located within an edge of the wide portion, and another portion of the vertical projection of the light-emitting diode device is located outside the edge of the wide portion.

14. The display panel according to claim 11, wherein the at least one of the power lines extends along a first direction, and a second direction is interlaced with the first direction, the pixel structures comprise an Mth pixel structure and an M+1th pixel structure sequentially arranged in the second direction, an light-emitting diode device of the Mth pixel structure and an light-emitting diode device of the M+1 pixel structure are disposed on the wide portion of the power line.

15. The display panel according to claim 11, wherein the wide portion has an alignment pattern.

16. The display panel according to claim 15, wherein the alignment pattern comprises at least one opening.

17. The display panel according to claim 16, wherein a vertical projection of the at least one opening does not overlap a vertical projection of the light-emitting diode device.

* * * * *